(12) United States Patent
Liaw

(10) Patent No.: US 10,522,423 B2
(45) Date of Patent: Dec. 31, 2019

(54) INTERCONNECT STRUCTURE FOR FIN-LIKE FIELD EFFECT TRANSISTOR

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 15/691,452

(22) Filed: Aug. 30, 2017

(65) Prior Publication Data

US 2019/0067131 A1 Feb. 28, 2019

(51) Int. Cl.
| | | |
|---|---|---|
| H01L 21/8238 | (2006.01) | |
| H01L 21/768 | (2006.01) | |
| H01L 23/522 | (2006.01) | |
| H01L 23/528 | (2006.01) | |
| H01L 27/092 | (2006.01) | |
| H01L 29/08 | (2006.01) | |

(52) U.S. Cl.
CPC ........ *H01L 21/823871* (2013.01); *H01L 21/76816* (2013.01); *H01L 21/76877* (2013.01); *H01L 21/823814* (2013.01); *H01L 21/823821* (2013.01); *H01L 23/528* (2013.01); *H01L 23/5226* (2013.01); *H01L 27/0924* (2013.01); *H01L 29/0847* (2013.01)

(58) Field of Classification Search
CPC ........ H01L 23/528; H01L 23/5283; H01L 23/5226; H01L 29/41791
See application file for complete search history.

(56) References Cited

U.S. PATENT DOCUMENTS

| | | | |
|---|---|---|---|
| 8,399,931 B2* | 3/2013 | Liaw | H01L 27/1104 257/288 |
| 8,582,352 B2* | 11/2013 | Liaw | G11C 11/412 365/154 |
| 9,318,502 B2 | 4/2016 | Son et al. | |
| 9,466,570 B1* | 10/2016 | Cheng | H01L 21/76897 |
| 9,466,722 B2 | 10/2016 | Liu et al. | |

(Continued)

FOREIGN PATENT DOCUMENTS

| | | |
|---|---|---|
| KR | 1020090070465 A | 7/2009 |
| KR | 20130111144 A | 10/2013 |
| KR | 20160025435 A | 3/2016 |

*Primary Examiner* — Cory W Eskridge
(74) *Attorney, Agent, or Firm* — Haynes and Boone, LLP

(57) ABSTRACT

Interconnect structures and corresponding formation techniques for fin-like field effect transistors (FinFETs) are disclosed herein. An exemplary interconnect structure for a FinFET includes a gate node via electrically coupled to a gate of the FinFET, a source node via electrically coupled to a source of the FinFET, and a drain node via electrically coupled to a drain of the FinFET. A source node via dimension ratio defines a longest dimension of the source node via relative to a shortest dimension of the source node via, and a drain node via dimension ratio defines a longest dimension of the drain node via relative to a shortest dimension of the drain node via. The source node via dimension ratio is greater than the drain node via dimension ratio. In some implementations, the source node via dimension ratio is greater than 2, and the drain node via dimension ratio is less than 1.2.

20 Claims, 10 Drawing Sheets

(56) References Cited

U.S. PATENT DOCUMENTS

| | | |
|---|---|---|
| 9,728,466 B1 | 8/2017 | Mallela et al. |
| 2008/0265330 A1 | 10/2008 | Gerhardt et al. |
| 2013/0069170 A1 | 3/2013 | Blatchford |
| 2015/0035023 A1* | 2/2015 | Kim ...................... H01L 29/785 257/288 |
| 2015/0221642 A1 | 8/2015 | Liaw |
| 2016/0197069 A1* | 7/2016 | Morrow et al. |
| 2016/0211251 A1* | 7/2016 | Liaw .................. H01L 27/0207 |
| 2017/0330794 A1* | 11/2017 | Hourani ................ H01L 23/528 |
| 2018/0082942 A1* | 3/2018 | Chawla ............. H01L 21/76802 |

* cited by examiner

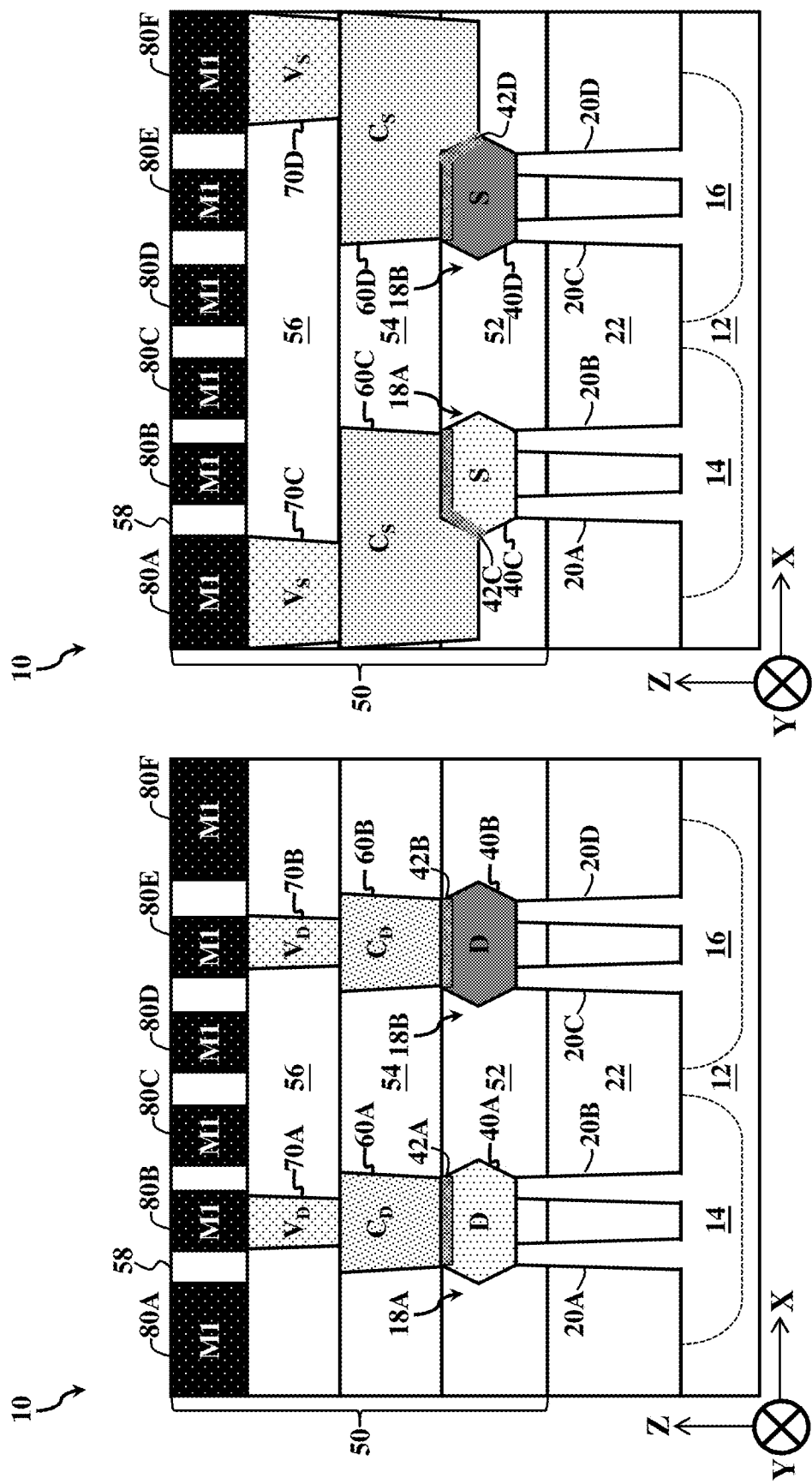

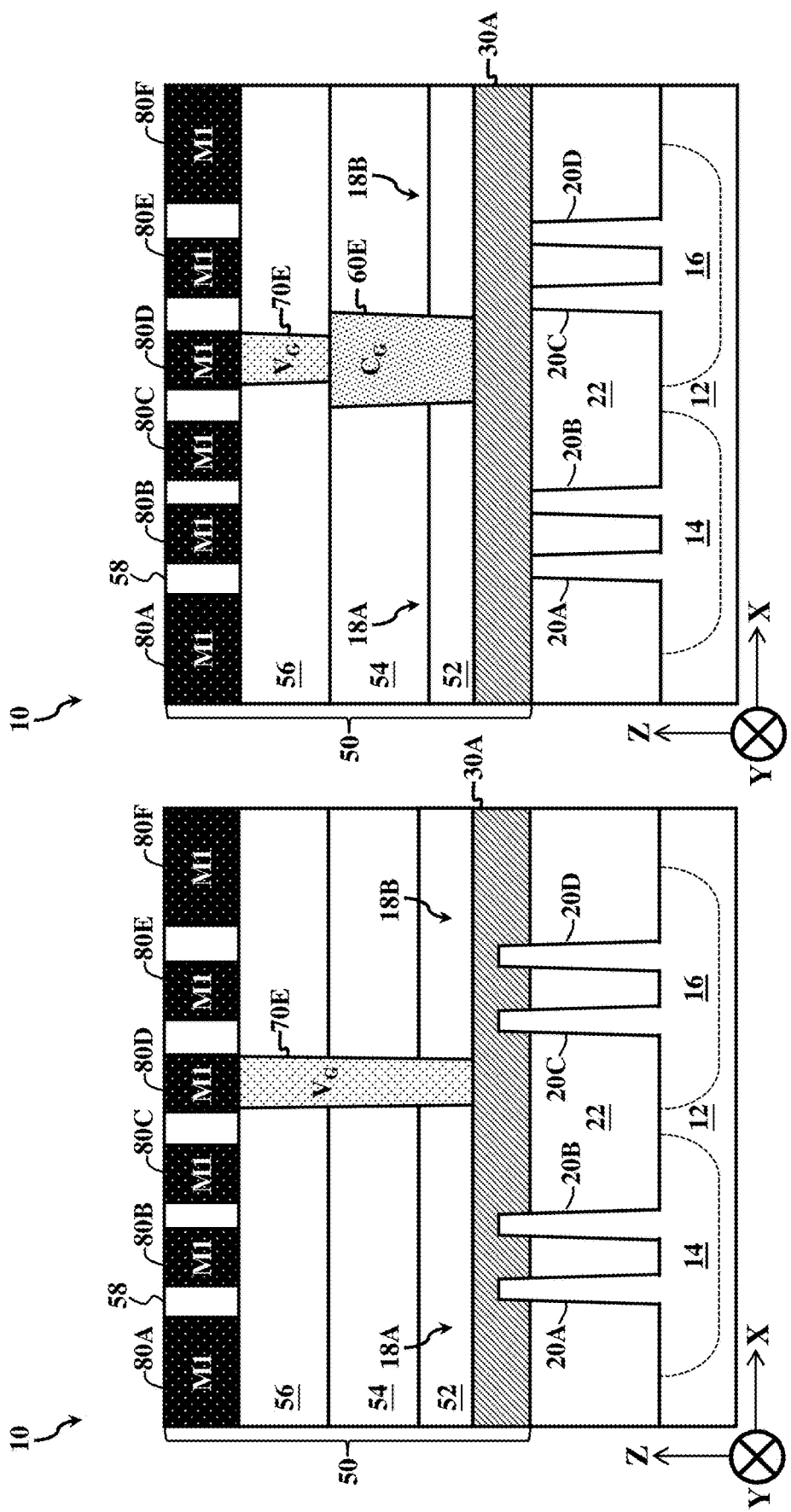

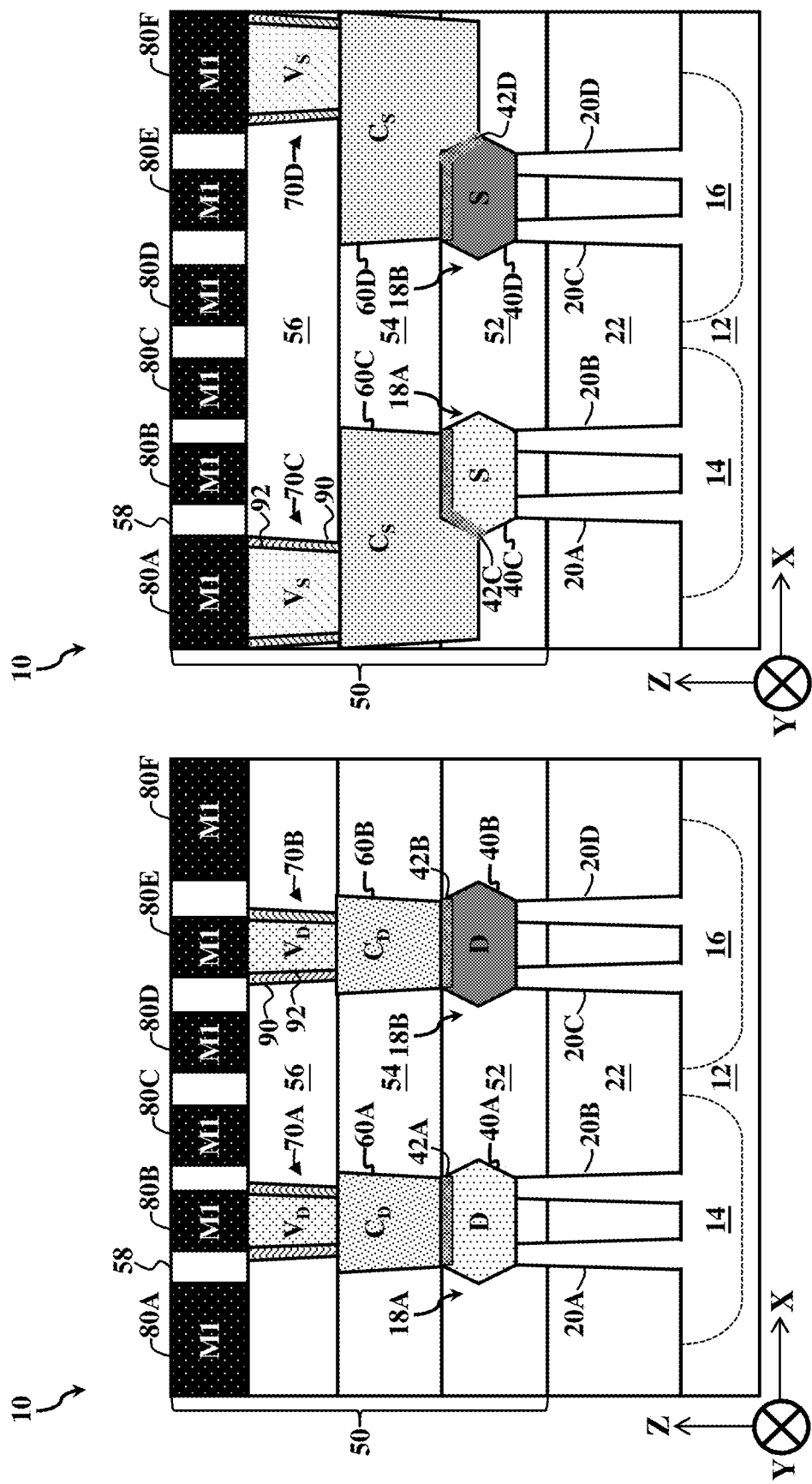

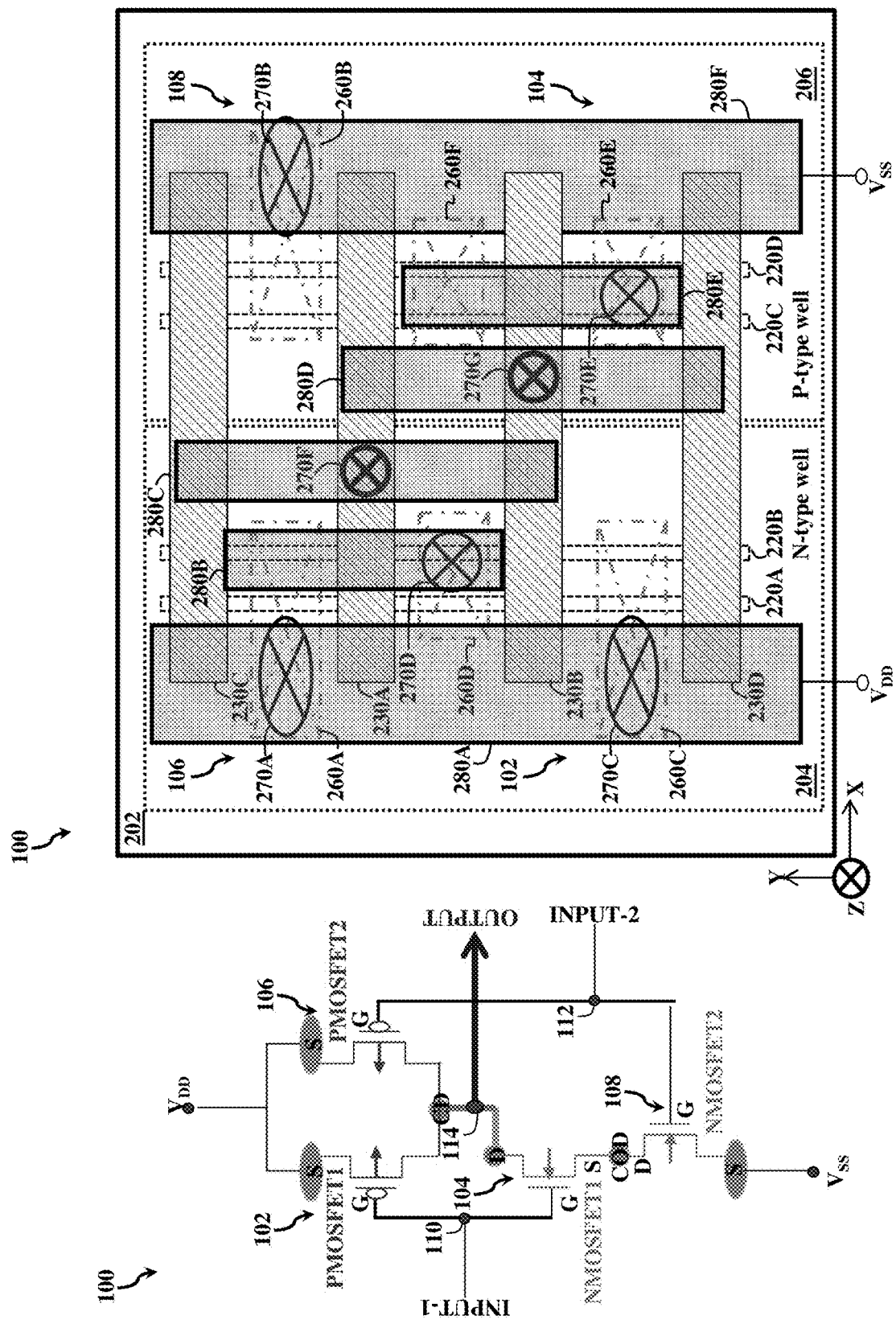

US 10,522,423 B2

INTERCONNECT STRUCTURE FOR FIN-LIKE FIELD EFFECT TRANSISTOR

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards sub-micron feature sizes, decreasing fin pitches and increasing fin heights are placing significant constraints on multi-layer interconnect (MLI) features used to facilitate operation of FinFET devices. For example, interconnect structures currently provided in advanced technology node MLI features exhibit higher than desirable resistance and poor electromigration performance. Accordingly, although existing interconnect structures and corresponding formation techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1B is a diagrammatic cross-sectional view of the FinFET device of FIG. 1A along line B-B according to various aspects of the present disclosure.

FIG. 1C is a diagrammatic cross-sectional view of the FinFET device of FIG. 1A along line C-C according to various aspects of the present disclosure.

FIG. 1D is a diagrammatic cross-sectional view of the FinFET device of FIG. 1A along line D-D according to various aspects of the present disclosure.

FIG. 2 is another diagrammatic cross-sectional view of the FinFET device of FIG. 1A along line D-D according to various aspects of the present disclosure.

FIG. 5A is another diagrammatic cross-sectional view of the FinFET device of FIG. 1A along line B-B according to various aspects of the present disclosure.

FIG. 5B is another diagrammatic cross-sectional view of the FinFET device of FIG. 1A along line C-C according to various aspects of the present disclosure.

FIG. 7A is a simplified circuit diagram of a FinFET-based NAND logic circuit, in portion or entirety, according to various aspects of the present disclosure.

FIG. 7B is a simplified schematic top view of an interconnect structure, in portion or entirety, of the FinFET-based NAND logic circuit of FIG. 7A according to various aspects of the present disclosure.

DETAILED DESCRIPTION

Figure 1A:
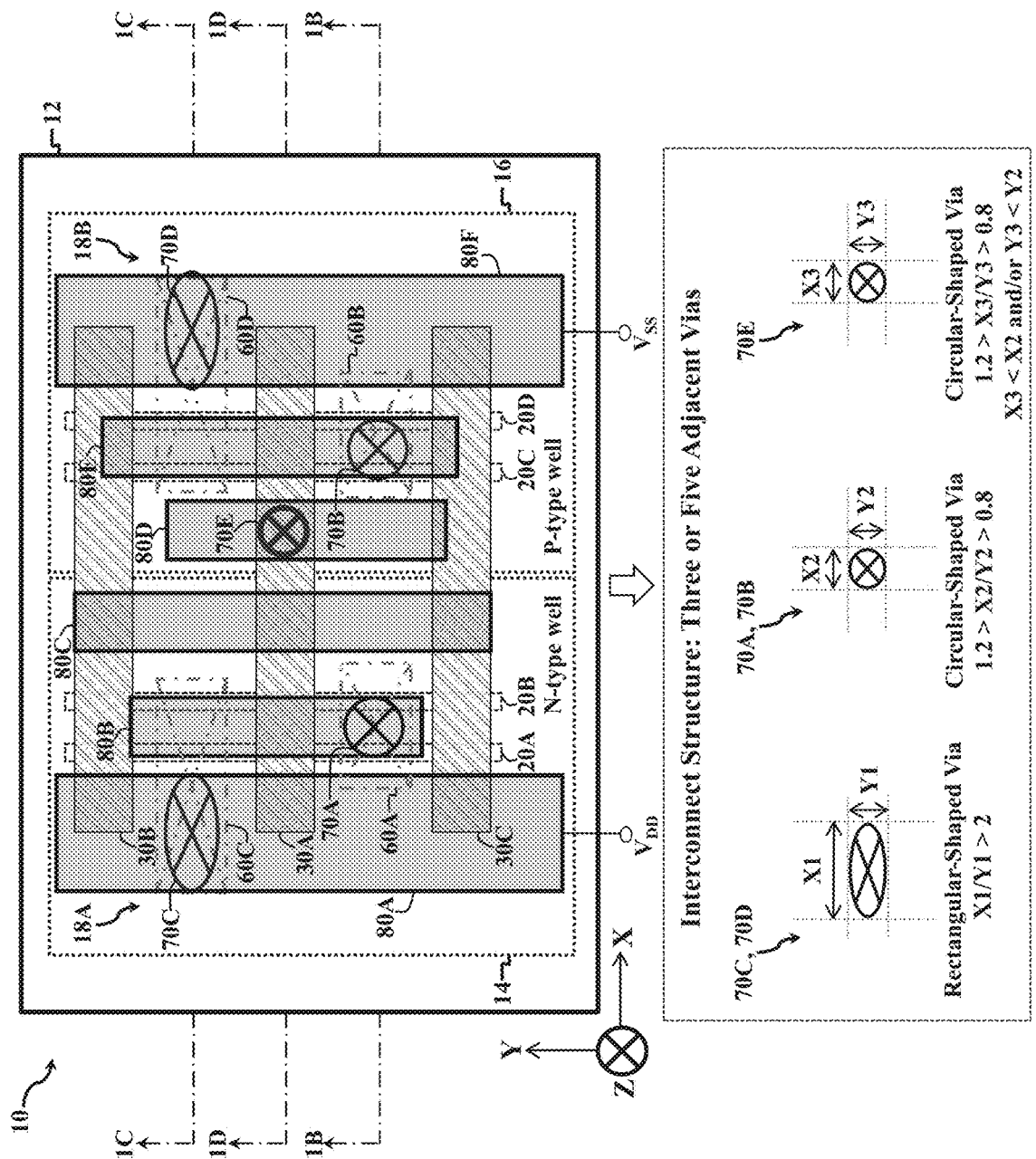
FIG. 1A is a simplified schematic top view of a fin-like field effect transistor (FinFET) device, in portion or entirety, having an interconnect structure that optimizes performance according to various aspects of the present disclosure.

The present disclosure relates generally to integrated circuit devices, and more particularly, to interconnect structures for fin-like field effect transistor (FinFET) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced integrated circuit (IC) technology nodes, FinFET devices (also referred to as non-planar transistors) have become a popular and promising candidate for high performance and low leakage applications, particularly for system-on-chip (SoC) products. A FinFET device has an elevated channel wrapped by a gate on more than one side (for example, the gate wraps a top and sidewalls of a "fin" of semiconductor material extending from a substrate). Compared to planar transistors, such configuration provides better control of the channel and drastically reduces short channel effects (in particular, by reducing sub-threshold leakage (i.e., coupling between a source and a drain of the FinFET device in the "off" state)). However, as FinFET technologies progress towards smaller technology nodes, decreasing fin pitch is placing significant constraints on multi-layer interconnect (MLI) features, which facilitate operation of the FinFET devices. For example, an MLI feature includes various conductive features (for example, device-level contacts, vias, and/or conductive lines) that electrically couple devices (for example, transistors, resistors, capacitors, and/or inductors) and/or components (for example, gate structures and/or source/drain features) of a FinFET device, such that the various devices and/or components can operate as specified by design requirements. Compacting the MLI feature to integrate with FinFET devices having advanced technology node pitch and/or spacing decreases contact area between the various conductive features of the MLI feature, which increases contact resistance exhibited by the MLI feature. It has been observed that contact resistance exhibited between vias and underlying conductive features (for example, device-level contacts) and/or overlying conductive features (for example, conductive lines) increases significantly as a pitch (distance) between vias shrinks to meet advanced technology node demands. FinFET devices are particularly sensitive to such increases in via contact resistance, which can significantly degrade the high performances of FinFET devices. The present disclosure thus proposes various interconnect structures (in particular, various via configurations) that enable FinFET devices to maintain high performance while achieving high density required for advanced technology nodes.

FIGS. 1A-1D are fragmentary diagrammatic views of a FinFET device 10, in portion or entirety, according to various aspects of the present disclosure. In particular, FIG. 1A is a simplified schematic top view of FinFET device 10 (for example, in an x-y plane); FIG. 1B is a diagrammatic cross-sectional view of FinFET device 10 along line B-B of FIG. 1A (for example, in an x-z plane); FIG. 1C is a diagrammatic cross-sectional view of FinFET device 10 along line C-C of FIG. 1A (for example, in an x-z plane); and FIG. 1D is a diagrammatic cross-sectional view of FinFET device 10 along line D-D of FIG. 1A (for example, in an x-z plane). FinFET device 10 generally refers to any fin-based transistor, which can be included in a microprocessor, a memory cell, and/or other integrated circuit (IC) device. In some implementations, FinFET device 10 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 1A-1D have been simplified for the sake of clarity to better understand the inventive concepts of the present disclosure. Additional features can be added in FinFET device 10, and some of the features described below can be replaced, modified, or eliminated in other embodiments of FinFET device 10.

FinFET device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 12 includes one or more group III-V materials. In some implementations, substrate 12 includes one or more group II-IV materials.

Substrate 12 includes various doped regions, such as a doped region 14 and a doped region 16, configured according to design requirements of FinFET device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. In the depicted embodiment, doped region 14 is configured for a p-type metal-oxide-semiconductor (PMOS) FinFET 18A, such as a pull-up (PU) FinFET, and doped region 16 is configured for an n-type MOS (NMOS) FinFET 18B, such as a pull-down (PD) FinFET, such that FinFET device 10 includes a CMOS FinFET. For example, doped region 14 is an n-type doped region, and doped region 16 is a p-type doped region. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions.

FinFET device 10 includes a fin 20A, a fin 20B, a fin 20C, and fin 20D (also referred to as active fin regions) disposed over substrate 12. In FIGS. 1A-1D, FinFET 18A includes fin 20A and fin 20B, and FinFET 18B includes fin 20C and fin 20D (in other words, PMOS FinFET 18A and FinFET 18B are multi-fin FinFETs, though the present disclosure contemplates embodiments where FinFET 18A and/or FinFET 18B include more or less fins, such as a single fin). Fins 20A-20D are oriented substantially parallel to one another, each having a width (w) defined in an x-direction, a length (l) defined in a y-direction, and a height (h) defined in a z-direction. In some implementations, height h is about 10 nm to about 200 nm, width w is about 3 nm to about 20 nm. For example, in the depicted embodiment, height h is about 20 nm to about 65 nm, and width w is about 5 nm to about 12 nm. Adjacent fins (such as fin 20A and fin 20B) are separated by a space S, where a pitch P generally refers to a sum of a width of a fin (such as w) and a width of a space adjacent to the fin (such as S) (in other words, P=w+S). In some implementations, space S is less than about 45 nm, such that pitch P is less than about 60 nm. For example, space S is about 10 nm to about 35 nm, and pitch P is about 15 nm to about 50 nm. In some implementations, pitch P is a minimum pitch achievable respectively between fins by a lithography process for a given technology node. The present disclosure contemplates variations in height, width, and length of fins 20A-20D that may arise from processing and fabrication. For example, in FIGS. 1A-1D, a width of fins 20A-20D varies from an upper portion of fins 20A-20D to a lower portion of fins 20A-20D, where width w represents an average of the varying widths. In the depicted embodiment, the width tapers from the upper portion of fins 20A-20D to the lower portion of fins 20A-20D, such that an average width of the upper portion is less than an average width of the lower portion. In some implementations, width w can vary from about 5 nm to about 15 nm along fins 20A-20D depending on where width w is measured along height h of fins 20A-20D. In some implementations, width w of fins 20A-20D varies depending on a position of fins 20A-20D relative to one another and/or relative to other features of FinFET device 10. For example, a width of center fins may be greater than a width of edge fins. In another example, alternatively, a width of center fins is less than a width of edge fins. In both such implementations, the width of edge fins can represent an average width of edge fins, and the width of center fins can represent an average width of center fins. In some implementations, a width of fins of FinFET 18A (here, fins 20A, 20B) are different than a width w of fins of FinFET 18B (here, fins 20C, 20D). In some implementations, the widths are not tapered, such that fins 20A-20D having substantially the same width along their height h.

Fins 20A-20D each have a channel region, a source region, and a drain region defined along their length in the y-direction, where the channel region is disposed between the source region and the drain region (generally referred to as source/drain regions). The channel region includes a top portion defined between sidewall portions, where the top portion and the sidewall portions engage with a gate structure (as described below), such that current can flow between the source region and the drain region during operation of FinFET device 10. The source/drain regions also include top portions defined between sidewall portions. In some implementations, fins 20A-20D are a portion of substrate 12 (such as a portion of a material layer of substrate 12). For example, where substrate 12 includes silicon, fins 20A-20D include silicon. Alternatively, in some implementations, fins 20A-20D are defined in a material layer, such as one or more semiconductor material layers, overlying substrate 12. For example, fins 20A-20D can include a semiconductor layer stack having various semiconductor layers (such as a heterostructure) disposed over substrate 12. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of FinFET device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a and c are different atomic percentages of silicon and b and d are different atomic percentages of germanium).

Fins 20A-20D are formed over substrate 12 using any suitable process. In some implementations, a combination of deposition, lithography and/or etching processes are performed to define fins 20A-20D extending from substrate 12 as illustrated in FIGS. 1A-1D. For example, forming fins 20A-20D includes performing a lithography process to form a patterned resist layer over substrate 12 (or a material layer, such as a heterostructure, disposed over substrate 12) and performing an etching process to transfer a pattern defined in the patterned resist layer to substrate 12 (or the material layer, such as the heterostructure, disposed over substrate 12). The lithography process can include forming a resist layer on substrate 12 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 12 (or a material layer disposed over substrate 12). The etching process can include a dry etching process (for example, a reactive ion etching (RIE) process), a wet etching process, other suitable etching process, or combinations thereof. After the etching process, the patterned resist layer is removed from substrate 12, for example, by a resist stripping process. Alternatively, fins 20A-20D are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fins 20A-20D. Further, in some implementations, the exposure process can implement maskless lithography, electron-beam (e-beam) writing, ion-beam writing, and/or nanoimprint technology for patterning the resist layer.

An isolation feature(s) 22 is formed over and/or in substrate 12 to isolate various regions, such as various device regions, of FinFET device 10. For example, isolation feature 22 separates and isolates active device regions and/or passive device regions from each other, such as FinFET 18A and FinFET 18B. Isolation feature 22 further separates and isolates fins 20A-20D from one another. In the depicted embodiment, isolation feature 22 surrounds a bottom portion of fins 20A-20D. Isolation feature 22 includes silicon oxide, silicon nitride, silicon oxynitride, other suitable isolation material (for example, including silicon, oxygen, nitrogen, carbon, or other suitable isolation constituent), or combinations thereof. Isolation feature 22 can include different structures, such as shallow trench isolation (STI) structures, deep trench isolation (DTI) structures, and/or local oxidation of silicon (LOCOS) structures. In some implementations, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 22. In some implementations, STI features can be formed by depositing an insulator material over substrate 12 after forming fins 20A-20D (in some implementations, such that the insulator material layer fills gaps (trenches) between fins 20A-20D) and etching back the insulator material layer to form isolation feature 22. In some implementations, isolation feature 22 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 22 includes a dielectric layer disposed over a doped liner layer (including, for example, boron silicate glass (BSG) or phosphosilicate glass (PSG)).

Various gate structures are disposed over fins 20A-20D, such as a gate structure 30A, a gate structure 30B, and a gate structure 30C. Gate structures 30A-30C extend along the x-direction (for example, substantially perpendicular to fins 20A-20D). In the depicted embodiment, gate structure 30A is disposed over the channel regions of fins 20A-20D. In some implementations, gate structure 30A wraps the channel regions of fins 20A-20D, thereby interposing the source/drain regions of fins 20A-20D. Gate structure 30A engages the channel regions of fins 20A-20D, such that current can flow between the source/drain regions of fins 20A-20D during operation. In furtherance of the depicted embodiment, gate structure 30A is an active gate structure, whereas gate structure 30B and gate structure 30C are dummy gate structures. "Active gate structure" generally refers to an electrically functional gate structure of FinFET device 10, whereas "dummy gate structure" generally refers to an electrically non-functional gate structure of FinFET device 10. In some implementations, a dummy gate structure mimics physical properties of an active gate structure, such as physical dimensions of the active gate structure, yet is inoperable (in other words, does not enable current to flow) in a FinFET. In FIGS. 1A-1D, gate structure 30B and gate structure 30C wrap portions of fins 20A-20D, positioned such that the source region of fins 20A-20D is disposed between gate structure 30A and gate structure 30B and the drain region of fins 20A-20D is disposed between gate structure 30A and gate structure 30C. In some implementations, gate structure 30B and/or gate structure 30C enable a substantially uniform processing environment, for example, enabling uniform epitaxial material growth in source/drain regions of fins 20A-20D (for example, when forming epitaxial source/drain features), uniform etch rates in source/drain regions of fins 20A-20D (for example, when forming source/drain recesses), and/or uniform, substantially planar surfaces (for example, by reducing (or preventing) CMP-induced dishing effects).

Gate structures 30A-30C include gate stacks configured to achieve desired functionality according to design requirements of FinFET device 10, such that gate structures 30A-30C include the same or different layers and/or materials. In some implementations, the gate stacks include a gate dielectric (for example, a gate dielectric layer) and a gate electrode (for example, a work function layer and a bulk (or fill) conductive layer). The gate stacks may include numerous other layers, for example, capping layers, interface layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), TaAl, TaAlC, TiAlN, TaC, TaCN, TaSiN, manganese (Mn), zirconium (Zr), other suitable n-type work function materials, or combinations thereof. In some implementations, the work function layer includes a p-type work function material, such as TiN, TaN, ruthenium (Ru), Mo, Al, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, and/or Cu. In some implementations, the bulk conductive layer additionally or collectively includes polysilicon, Ti, Ta, metal alloys, other suitable materials, or combinations thereof. In some implementations, since gate structures 30A-30C span FinFET 18A (configured as a PMOS) and FinFET 18B (configured as an NMOS), gate structures 30A-30C have different layers in regions corresponding with FinFET 18A and FinFET 18B. For example, in some implementations, gate structure 30A includes a p-type work function layer in a region corresponding with FinFET 18A, an n-type work function layer in a region corresponding with FinFET 18B, and a bulk conductive layer disposed over the p-type work function layer and the n-type work function layer.

Gate structures 30A-30C are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. The gate stacks are fabricated according to a gate last process, a gate first process, or a hybrid gate last/gate first process. In gate last process implementations, one or more of gate structures 30A-30C include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which the metal gate stacks are formed. In some implementations, the dummy gate stack of gate structure 30A is replaced with a metal gate stack, while dummy gate stacks remain in gate structure 30B and gate structure 30C. In some implementations, the dummy gate stacks of gate structures 30A-30C are replaced with metal gate stacks.

In some implementations, gate structures 30A-30C further include spacers disposed adjacent to (for example, along sidewalls of) the gate stacks. The gate spacers are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form the gate spacers. In some implementations, the gate spacers include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the metal gate stacks. In such implementations, the various sets of spacers can include materials having different etch rates. For example, a first dielectric layer including silicon and oxygen (for example, silicon oxide) can be deposited over substrate 12 and subsequently anisotropically etched to form a first spacer set adjacent to the gate stacks, and a second dielectric layer including silicon and nitrogen (for example, silicon nitride) can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming the spacers.

Epitaxial source features and epitaxial drain features (referred to as epitaxial source/drain features) are disposed over the source/drain regions of fins 20A-20D. For example, semiconductor material is epitaxially grown on fins 20A-20D, forming epitaxial source/drain features 40A-40D. In some implementations, epitaxial source/drain features 40A-40D are formed over the source/drain regions of fins 20A-20D after a fin recess process (for example, an etch back process), such that epitaxial source/drain features 40A-40D are grown from recessed fins 20A-20D. In some implementations, epitaxial source/drain features 40A-40D wrap the source/drain regions of fins 20A-20D. In such implementations, fins 20A-20D may not be subjected to a fin recess process. Epitaxial source/drain features 40A-40D extend (grow) laterally along the x-direction (in some implementations, substantially perpendicular to fins 20A-20D), such that epitaxial source/drain features 40A-40D are merged epitaxial source/drain features that span more than one fin (for example, epitaxial source/drain feature 40A spans fin 20A and fin 20B). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 40A-40D are doped with n-type dopants and/or p-type dopants. In the depicted embodiment, where FinFET 18A is a PMOS FinFET (for example, having a p-channel), epitaxial source/drain features 40A, 40C are epitaxial layers including silicon and/or germanium, where the silicon germanium containing epitaxial layers are doped with boron, carbon, other p-type dopant, or combinations thereof (for example, forming a Si:Ge:B epitaxial layer). In furtherance of the depicted embodiment, where FinFET 18B is an NMOS FinFET device (for example, having an n-channel), epitaxial source/drain features 40B, 40D are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer or a Si:C:P epitaxial layer). In some implementations, epitaxial source/drain features 40A-40D include materials and/or dopants that achieve desired tensile stress and/or compressive stress in the channel region. In some implementations, epitaxial source/drain features 40A-40D are doped during deposition by adding impurities to a source material of the epitaxy process. In some implementations, epitaxial source/drain features 40A-40D are doped by an ion implantation process subsequent to a deposition process. In some implementations, annealing processes are performed to activate dopants in epitaxial source/drain features 40A-40D and/or other source/drain regions of FinFET device 10, such as HDD regions and/or LDD regions (both of which are not shown).

As depicted in FIGS. 1A-1D, silicide layers are formed on epitaxial source/drain features 40A-40D, such as a silicide layer 42A, a silicide layer 42B, a silicide layer 42C, and a silicide layer 42D. In some implementations, silicide layers 42A-42D are formed by depositing a metal layer over epitaxial source/drain features 40A-40D. The metal layer includes any material suitable for promoting silicide formation, such as nickel, platinum, palladium, vanadium, titanium, cobalt, tantalum, ytterbium, zirconium, other suitable metal, or combinations thereof. FinFET device 10 is then heated (for example, subjected to an annealing process) to cause constituents of epitaxial source/drain features 40A-

40D (for example, silicon and/or germanium) to react with the metal. Silicide layers 42A-42D thus include metal and a constituent of epitaxial source/drain features 40A-40D (for example, silicon and/or germanium). In some implementations, silicide layers 42A-42D include nickel silicide, titanium silicide, or cobalt silicide. Any un-reacted metal, such as remaining portions of the metal layer, is selectively removed by any suitable process, such as an etching process. In some implementations, silicide layers 42A-42D and epitaxial source/drain features 40A-40D are collectively referred to as the epitaxial source/drain features of FinFET device 10.

A multilayer interconnect (MLI) feature 50 is disposed over substrate 12. MLI feature 50 electrically couples various devices (for example, transistors, resistors, capacitors, and/or inductors) and/or components (for example, gate structures and/or source/drain features) of FinFET device 10, such that the various devices and/or components can operate as specified by design requirements of FinFET device 10. MLI feature 50 includes a combination of dielectric layers and conductive layers configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 50. In some implementations, heights of vertical interconnect features (here, along the z-direction) are greater than heights of horizontal interconnect features. During operation of FinFET device 10, the interconnect structures are configured to route signals between the devices and/or the components of FinFET device 10 and/or distribute signals (for example, clock signals, voltage signals, and/or ground signals) to the devices and/or the components of FinFET device 10. It is noted that though MLI feature 50 is depicted with a given number of dielectric layers and conductive layers, the present disclosure contemplates MLI feature 50 having more or less dielectric layers and/or conductive layers.

MLI feature 50 includes one or more dielectric layers, such as an interlayer dielectric layer 52 (ILD-0) disposed over substrate 12, an interlayer dielectric layer 54 (ILD-1) disposed over ILD layer 52, an interlayer dielectric layer 56 (ILD-2) disposed over ILD layer 54, and an interlayer dielectric layer 58 (ILD-3) disposed over ILD layer 56. ILD layers 52-58 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, ILD layers 52-58 are dielectric layers that include a low-k dielectric material (generally referred to as low-k dielectric layers), which generally refers to materials having a dielectric constant (k) that is less than 3. For example, ILD layers 52-58 are $SiO_2$ layers). ILD layers 52-58 can include a multilayer structure having multiple dielectric materials. MLI feature 50 can further include one or more contact etch stop layers (CESLs) disposed between ILD layers 52-58, such as a CESL between ILD layer 52 and ILD layer 54, a CESL disposed between ILD layer 54 and ILD layer 56, and a CESL disposed between ILD layer 56 and ILD layer 58. In some implementations, a CESL is disposed between substrate 12 and/or isolation feature 22 and ILD layer 52. CESLs include a material different than ILD layers 52-58, such as a dielectric material that is different than the dielectric material of ILD layers 52-58. For example, where ILD layers 52-58 include a low-k dielectric material, CESLs include silicon and nitrogen, such as silicon nitride or silicon oxynitride. ILD layers 52-58 are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers 52-58 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 52-58, a CMP process and/or other planarization process is performed, such that ILD layers 52-58 have substantially planar surfaces.

Device-level contacts 60A-60D, vias 70A-70E, and conductive lines 80A-80F are disposed in ILD layers 52-58 to form interconnect structures. Device-level contacts 60A-60D, vias 70A-70E, and conductive lines 80A-80F have widths defined in the x-direction, lengths defined in the y-direction, and heights defined in the z-direction. In FIGS. 1A-1D, device-level contacts 60A-60D and vias 70A-70E extend in a direction substantially perpendicular to a direction along which fins 20A-20D extend, while conductive lines 80A-80F extend in a direction substantially parallel to the direction along which fins 20A-20D extend. However, the present disclosure contemplates other orientations of device-level contacts 60A-60D, vias 70A-70E, and/or conductive lines 80A-80F.

Device-level contacts 60A-60D (also referred to as local interconnects or local contacts) electrically couple and/or physically couple IC device features, such as features of FinFET 18A and FinFET 18B, to vias 70A-70E of MLI feature 50. For example, device-level contacts 60A-60D are metal-to-device (MD) contacts, which generally refer to contacts to a conductive region, such as source/drain regions, of FinFET device 10. In the depicted embodiment, device-level contact 60A and device-level contact 60B are respectively disposed on epitaxial source/drain feature 40A and epitaxial source/drain feature 40B, such that device-level contact 60A and device-level contact 60B physically (or directly) connect the drain regions of FinFET 18A and FinFET 18B respectively to via 70A and via 70B. In furtherance of the depicted embodiment, device-level contact 60C and device-level contact 60D are respectively disposed on epitaxial source/drain feature 40C and epitaxial source/drain feature 40D, such that device-level contact 60C and device-level contact 60D physically (or directly) connect the source regions of FinFET 18A and FinFET 18B respectively to via 70C and via 70D. Device-level contacts 60A, 60B can be referred to as drain contacts ($C_D$), and device-level contacts 60C, 60D can be referred to as source contacts ($C_S$). Device-level contacts 60A-60D have any suitable dimensions depending on design requirements of FinFET device 10. In FIGS. 1A-1D, widths of device-level contacts 60A-60D are greater than lengths of device-level contacts 60A-60D. In some implementations, widths and/or lengths of source contacts (here, device-level contacts 60C, 60D) are greater than widths and/or lengths of drain contacts (here, device-level contacts 60A, 60B). In some implementations, widths and/or lengths of drain contacts are greater than widths and/or lengths of source contacts. In some implementations, drain contacts have the same dimensions (such as widths, lengths and/or heights), and source contacts have the same dimensions, but the dimensions of the drain contacts are different than the dimensions of the source contacts. Device-level contacts 60A-60D extend through ILD layer 52 and/or ILD layer 54, though the present disclosure contemplates embodiments where device-level contacts 60A-60D extend through more or less ILD layers and/or CESLs of MLI feature 50. In some implementations, device-level contacts 60A-60D are middle-end-of-line (MEOL) conductive features that interconnect front-end-of-line (FEOL) conductive features (for example, gate structure 30A and/or epitaxial source/drain features 40A-40D) to back-end-of-line (BEOL) conductive features (for example, vias 70A-70E), thereby electrically and/or physically coupling FEOL conductive features to BEOL conductive features.

Vias 70A-70D electrically couple and/or physically couple conductive features of MLI feature 50 to one another. For example, via 70A is disposed on device-level contact 60A, such that via 70A physically (or directly) connects device-level contact 60A to conductive line 80B; via 70B is disposed on device-level contact 60B, such that via 70B physically (or directly) connects device-level contact 60B to conductive line 80E; via 70C is disposed on device-level contact 60C, such that via 70C physically (or directly) connects device-level contact 60C to conductive line 80A (which is electrically coupled to a power supply voltage ($V_{DD}$) (in some implementations, configured as a positive supply voltage depending on design requirements)); and via 70D is disposed on device-level contact 60D, such that via 70D physically (or directly) connects device-level contact 60D to conductive line 80F (which is electrically coupled to a power supply voltage ($V_{SS}$) (in some implementations, configured as a negative supply voltage and/or ground)). Vias 70A, 70B electrically couple drain regions respectively of FinFET 18A and FinFET 18B to conductive lines 80A-80F (collectively referred to as a metal one (M1) layer) of MLI feature 50 (and are thus referred to as drain node vias ($V_D$)); and vias 70C, 70D electrically couple source regions respectively of FinFET 18A and FinFET 18B the M1 layer of MLI feature 50 (and are thus referred to as source node vias ($V_S$)). Vias 70A-70D extend through ILD layer 54, though the present disclosure contemplates embodiments where vias 70A-70D extend through more or less ILD layers and/or CESLs of MLI feature 50. In some implementations, vias 70A-70D are BEOL conductive features that interconnect MEOL conductive features (for example, device-level contacts 60A-60D) to BEOL conductive features (for example, conductive lines 80A-80F), thereby electrically and/or physically coupling MEOL conductive features to BEOL conductive features. In some implementations, MLI feature 50 further includes vias that are BEOL conductive features that interconnect BEOL conductive features in different ILD layers to one another, such as conductive lines 80A-80F (in other words, the M1 layer) to conductive lines disposed in other ILD layers (such as a metal two (M2) layer of MLI feature 50, not shown) overlying ILD layers 52-58, thereby electrically and/or physically coupling BEOL conductive features of FinFET device 10.

MLI feature 50 further includes via 70E that electrically couples and/or physically couples an IC device feature to a conductive feature of MLI feature 50. In FIG. 1D, via 70E is disposed on gate structure 30A, such that via 70E physically (or directly) connects gate structure 30A to conductive line 80D. Via 70E extends through ILD layer 52, ILD layer 54, and ILD layer 56, though the present disclosure con- templates embodiments where via 70E extends through more or less ILD layers and/or CESLs of MLI feature 50. In such implementations, via 70E is physically and electrically coupled with gate structure 30A. In alternative implementations, such as depicted in FIG. 2, MLI feature 50 further includes a device-level contact 60E that electrically couples and/or physically couples gate structure 30A to via 70E. For example, device-level contact 60E is disposed on gate structure 30A, such that device-level contact 60E physically (or directly) connects gate structure 30A to via 70E, and via 70E physically (or directly) connects device-level contact 60E to conductive line 80D. Device-level contact 60E is thus referred to as a gate contact ($C_G$) or metal-to-poly (MP) contact, which generally refers to a contact to a gate structure, such as a poly gate structure or a metal gate structure. In such implementations, device-level contact 60E extends through ILD layer 52 and ILD layer 54, and via 70E extends through ILD layer 56, though the present disclosure contemplates embodiments where device-level contact 60E and/or via 70E extend through more or less ILD layers and/or CESLs of MLI feature 50. In the implementations depicted in both FIG. 1D and FIG. 2, via 70E electrically couples a gate of FinFET 18A and a gate of FinFET 18B to the M1 layer (at least one of conductive lines 80A-80F) of MLI feature 50 (and is thus referred to as gate node via ($V_G$)).

Turning again to FIGS. 1A-1D, dimensions of vias 70A-70E are configured to allow FinFET device 10 to achieve both high density (in other words, meet minimum pitch/spacing) and high performance demands of ever-shrinking IC technology nodes. In particular, vias 70A-70E each have a via dimension ratio defined as a ratio between a value of a longest dimension (or side) respectively of vias 70A-70E to a value of a shortest dimension (or side) respectively of vias 70A-70E (thus, the via dimension ratio=longest dimension/shortest dimension). For example, source node vias, such as via 70C and via 70D, each have a longest dimension (in the depicted embodiment, X1, which represents a width (W1) of vias 70C, 70D extending in the x-direction) and a shortest dimension (in the depicted embodiment, Y1, which represents a length (L1) of vias 70C, 70D extending in the y-direction), where a source node via dimension ratio of the longest dimension to the shortest dimension is greater than 2 (in other words, X1/Y1>2 and/or W1/L1>2). In some implementations, X1 is about 15 nm to about 150 nm, and Y1 is about 5 nm to about 40 nm. Further, drain node vias, such as via 70A and via 70B, each have a longest dimension (in the depicted embodiment, X2, which represents a width (W2) of vias 70A, 70B extending in the x-direction) and a shortest dimension (in the depicted embodiment, Y2, which represents a length (L2) of vias 70A, 70B extending in the y-direction), where a drain node via dimension ratio of the longest dimension to the shortest dimension is from about 0.8 to about 1.2 (in other words, 1.2>X2/Y2>0.8 and/or 1.2>W2/L2>0.8). In some implementations, the longest dimension is substantially equal to the shortest dimension. In some implementations, X2 is about 5 nm to about 40 nm, and Y2 is about 5 nm to about 40 nm. The source node vias thus have a greater via dimension ratio than the drain node vias, where the source node vias are rectangular-shaped and the drain node vias are circular-shaped. Such configuration increases a contact area between the source node vias (here, vias 70C, 70D) and device-level contacts 60C, 60D and minimizes a contact area between the drain node vias (here, vias 70A, 70B) and device-level contacts 60A, 60B, decreasing a contact resistance exhibited by the source node vias while decreasing a capacitance on the drain node vias.

During operation, since source nodes are often connected to power supply voltages, such as $V_{DD}$ or $V_{SS}$, and drain nodes are often configured as output nodes (in some implementations, outputting a voltage that indicates a logic one (1) or a logic (0)), minimizing (or eliminating) resistance at the source nodes improves device currents (I) while minimizing (or eliminating) capacitance at the drain nodes improves device speed (I/C). By implementing the interconnect structures described herein, FinFET device 10 thus meets both high density and high performance demands for advanced technology nodes, particularly for high speed SoC applications. Different embodiments may have different advantages, and no particular advantage is necessarily required of any embodiment.

In furtherance of the depicted embodiment, gate node vias, such as via 70E, each have a longest dimension (in the depicted embodiment, X3, which represents a width (W3) of via 70E extending in the x-direction) and a shortest dimension (in the depicted embodiment, Y3, which represents a length (L3) of via 70E extending in the y-direction), where a gate node via dimension ratio of the longest dimension to the shortest dimension is from about 0.8 to about 1.2 (in other words, 1.2>X3/Y3>0.8 and/or 1.2>W3/L3>0.8). In some implementations, the longest dimension is substantially equal to the shortest dimension. In some implementations, X3 is about 4 nm to about 35 nm, and Y3 is about 4 nm to about 35 nm. The gate node vias are thus circular-shaped, similar to the drain node vias (vias 70A, 70B). However, the drain node vias have at least one dimension, such as the longest dimension and/or the shortest dimension, greater than the gate node vias (in other words, X2>X3 and/or Y2>Y3). For example, vias 70A, 70B have widths and/or lengths that are greater than the width and/or the length of via 70E. Minimizing a size of the gate node vias (such as the gate node via dimension ratio or dimensions of the gate node vias) relative to a size of the drain node vias and/or the source node vias (such as the drain node via dimension ratio, the source node via dimension ration, dimensions of the drain node vias and/or dimensions of the source node vias) increases spacing between adjacent vias, thereby facilitating higher MLI feature density and improved via-to-via isolation margins. Further, in the depicted embodiment, the source node vias have at least one dimension, such as the longest dimension and/or the shortest dimension, greater than the drain node vias (in other words, X1>X2 and/or Y1>Y2). For example, vias 70C, 70D have widths and/or lengths that are greater than the widths and/or the lengths of vias 70A, 70B. In some implementations, vias 70A-70E have a height that is about 5 nm to about 70 nm. It is noted that, in the depicted embodiment, the longest dimensions of the source node vias, the drain node vias, and the gate node vias each extend in a first direction (here, the x-direction), while the shortest dimensions of the source node vias, the drain node vias, and the gate node vias each extend in a second direction that is substantially perpendicular to the first direction (here, the y-direction). However, the present disclosure contemplates embodiments where the second direction is not substantially perpendicular to the first direction. The present disclosure further contemplates embodiments where the source node vias, the drain node vias, and/or the gate node vias have longest dimensions and/or shortest dimensions that extend in different directions. For example, the longest dimensions and/or the shortest dimensions of the source node vias, the drain node vias, and the gate node vias may extend in three different directions.

Figure 3:
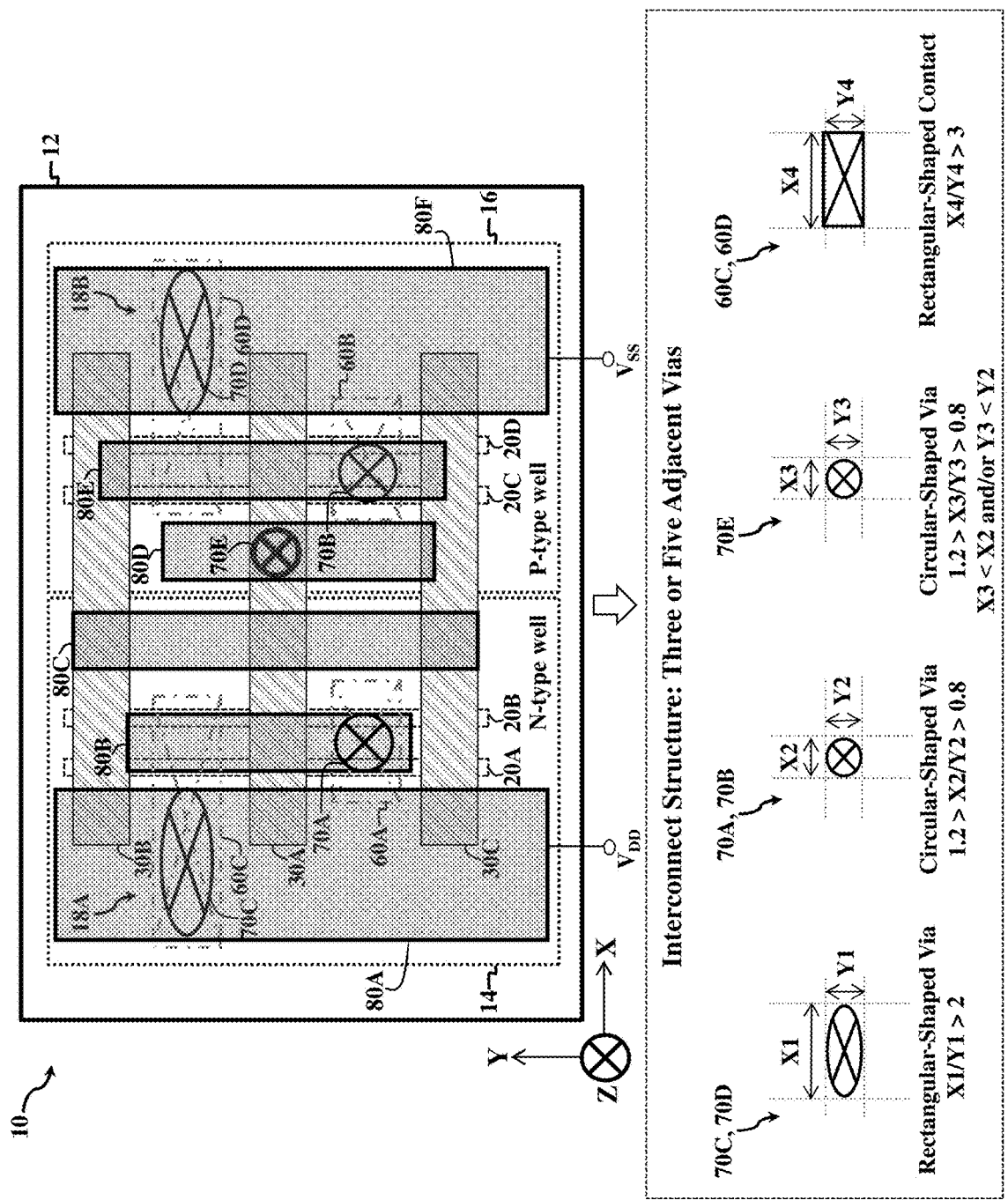
FIG. 3 is another simplified schematic top view of the FinFET device of FIGS. 1A-1D, in portion or entirety, according to various aspects of the present disclosure.
Figure 4:
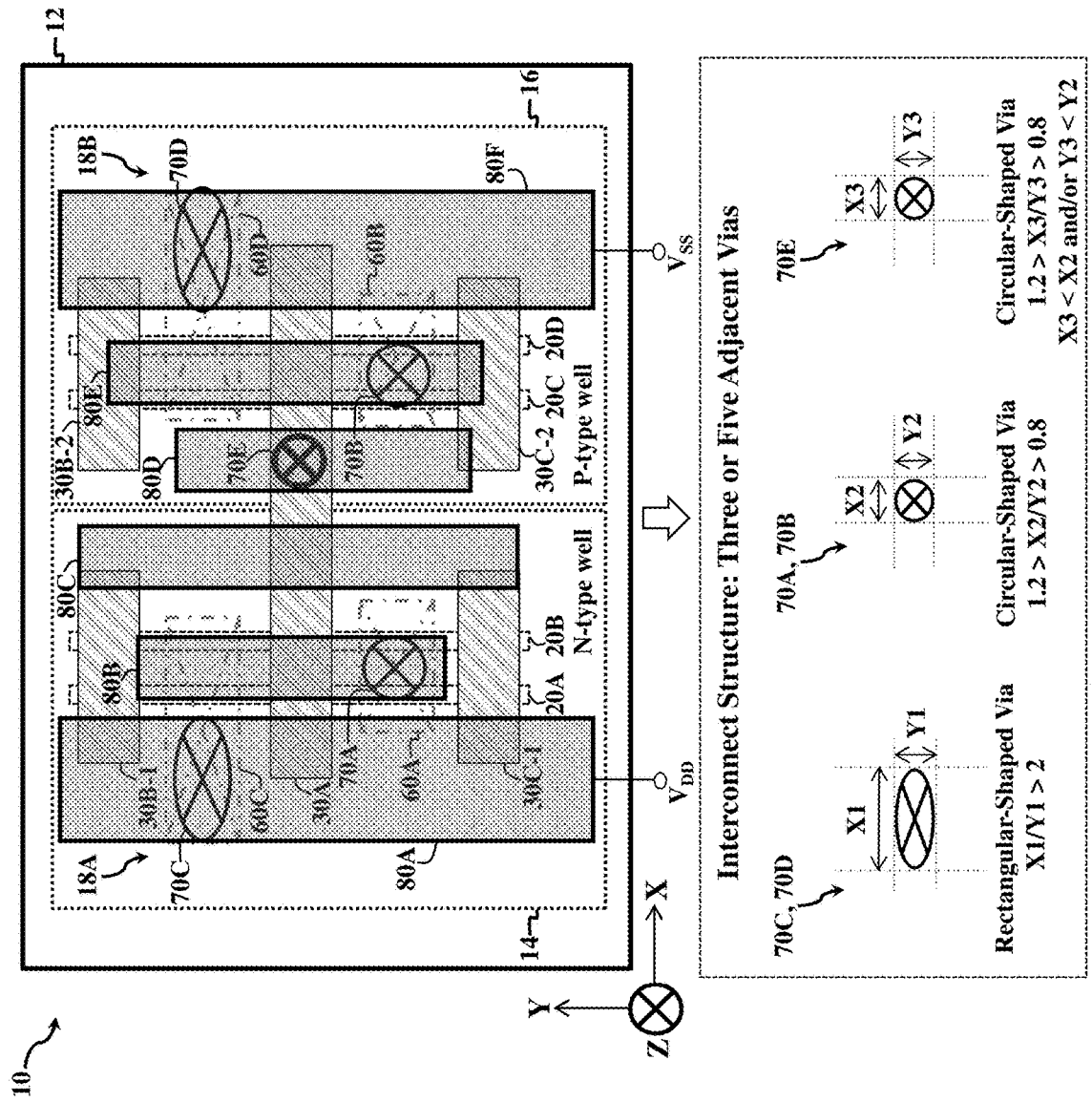
FIG. 4 is yet another simplified schematic top view of the FinFET device of FIGS. 1A-1D, in portion or entirety, according to various aspects of the present disclosure.

FinFET device 10 is thus provided with an interconnect structure having a via configuration that enhances performance. For example, FinFET device 10 includes an interconnect structure having five adjacent vias: two source node vias (vias 70C, 70D), two drain node vias (vias 70A, 70B), and a gate node via (via 70E) shared by FinFET 18A and FinFET 18B, where a source node via dimension ratio is greater than a drain node via dimension ratio. Further, FinFET 18A and FinFET 18B each include an interconnect structure having three adjacent vias: a source node via (via 70C or via 70D), a drain node via (via 70A or via 70B), and a gate node via (via 70E), where a source node via dimension ratio is greater than a drain node via dimension ratio. In some implementations, at least one of the device-level source contacts (here, device-level contacts 60C, 60D) has a device-level source contact ratio defined as a ratio between a value of a longest dimension (or side) respectively of the device-level source contacts to a value of a shortest dimension (or side) respectively of the device-level source contacts (thus, the device-level source contact ratio=longest dimension/shortest dimension), where the device-level source contact ratio is greater than the source node via contact ratio. For example, in FIG. 3, device-level contacts 60C, 60D have a longest dimension (in the depicted embodiment, X4, which represents a width (W4) of device-level contacts 60C, 60D extending in the x-direction) and a shortest dimension (in the depicted embodiment, Y4, which represents a length (L3) of device-level contacts 60C, 60D extending in the y-direction), where a device-level source contact dimension ratio of the longest dimension to the shortest dimension is greater than 3 (in other words, X4/Y4>3 and/or W4/L4>3). In such implementations, device-level contacts 60C, 60D are thus rectangular-shaped, similar to vias 70C, 70D, except device-level contacts 60C, 60D have a greater dimension ratio than vias 7C, 70D, respectively. The greater dimension ratio of device-level contacts 60C, 60D relative to vias 70C, 70D further reduces resistance at interfaces between device-level contacts 60C, 60D and vias 70C, 70D (generally referred to as contact resistance), further improving performance of FinFET device 10. In some implementations, X4 is about 15 nm to about 400 nm, and Y4 is about 5 nm to about 50 nm. In some implementations, gate structures 30A-30C can be configured differently depending on design requirements of FinFET device 10. For example, in FIG. 4, dummy gate structures are split between FinFET 18A and FinFET 18B, such that gate structure 30B is split into gate structure 30B-1 and gate structure 30B-2 and gate structure 30C is split into gate structure 30C-1 and gate structure 30C-2. Gate structures 30B-1, 30C-1 are disposed over fins 20A, 20B of FinFET 18A; and gate structures 30B-2, 30C-2 are disposed over fins 20C, 20D of FinFET 18B. Splitting the gate structures can be used for isolating source/drain regions. In some implementations, gate structures 30B-1, 30C-1 are electrically coupled to a power supply voltage, such as $V_{DD}$, and gate structures 30B-2, 30C-2 are electrically coupled to a power supply voltage, such as $V_{SS}$, to isolate adjacent source/drain regions of FinFET device 10.

Turning again to FIGS. 1A-1D, device-level contacts 60A-60D, vias 70A-70E, and conductive lines 80A-80F include any suitable conductive material, such as Ta, Ti, Al, Cu, Co, W, TiN, TaN, other suitable conductive materials, or combinations thereof. Various conductive materials can be combined to provide device-level contacts 60A-60D, vias 70A-70E, and/or conductive lines 80A-80F with various layers, such as a barrier layer, an adhesion layer, a liner layer, a bulk layer, other suitable layer, or combinations thereof. In some implementations, device-level-contacts 60A-60D include Ti, TiN, and/or Co; vias 70A-70E include Ti, TiN, and/or W; and conductive lines 80A-80F include Cu, Co, and/or Ru. Device-level contacts 60A-60D, vias 70A-70E, and conductive lines 80A-80F are formed by patterning ILD layers 52-58. Patterning ILD layers 52-58 can include lithography processes and/or etching processes to form openings (trenches), such as contact openings, via openings, and/or line openings in respective ILD layers 52-58. In some implementations, the lithography processes include forming a resist layer over respective ILD layers 52-58, exposing the resist layer to pattern radiation, and developing the exposed resist layer, thereby forming a patterned resist layer that can be used as a masking element for etching opening(s) in respective ILD layers 52-58. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 52-58, device-level contacts 60A-60D, vias 70A-70E, and/or conductive lines 80A-80F.

In some implementations, at least one of vias 70A-70E includes a via liner layer that includes a high-k dielectric material, which generally refers to a material having a dielectric constant (k) greater than about 4.5 (k>4.5). For example, in FIG. 5A and FIG. 5B, the drain node vias (here, vias 70A, 70B) and the source node vias (here, vias 70C, 70D) include a via liner layer 90 that includes a high-k dielectric material, and a via bulk layer 92 that includes a conductive material. In some implementations, the high-k dielectric material includes a nitride-based dielectric material, a metal oxide-based dielectric material, a hafnium-based dielectric material, other suitable high-k dielectric material, or combinations thereof. For example, the high-k dielectric material includes $HfO_2$, HfSiO, HfSiON, HfTaO, HfTiO, HfZrO, $HfO_2$—$Al_2O_3$, tantalum oxide, zirconium oxide, aluminum oxide, other suitable high-k dielectric materials, or combinations thereof. Via liner layer 90 further enhances performance of FinFET device 10, for example, by further improving via-to-via isolation margins and increasing breakdown voltages of FinFET 18A and/or FinFET 18B. Via liner layer 90 and via bulk layer 92 fill via openings having sidewalls defined by ILD layer 56 and bottoms defined by respective device-level contacts 60A-60D. In the depicted embodiment, via liner layer 90 is disposed on sidewalls of vias 70A-70D, and via bulk layer 92 is disposed on via liner layer 90. In some implementations, via liner layer 90 has a thickness of about 5 Å to about 30 Å. In some implementations, though not depicted, the gate node vias (here, via 70E) include via liner layer 90 and via bulk layer 92. Alternatively, in some implementations where device-level contacts 60A-60D include cobalt, via liner layer 90 includes a first via barrier layer that includes titanium (for example, disposed on the sidewalls) and a second via barrier layer that includes titanium and nitrogen (for example, disposed on the second via barrier layer). In such implementations, via bulk layer 92 includes tungsten and/or cobalt.

Figures 6A, 6B:
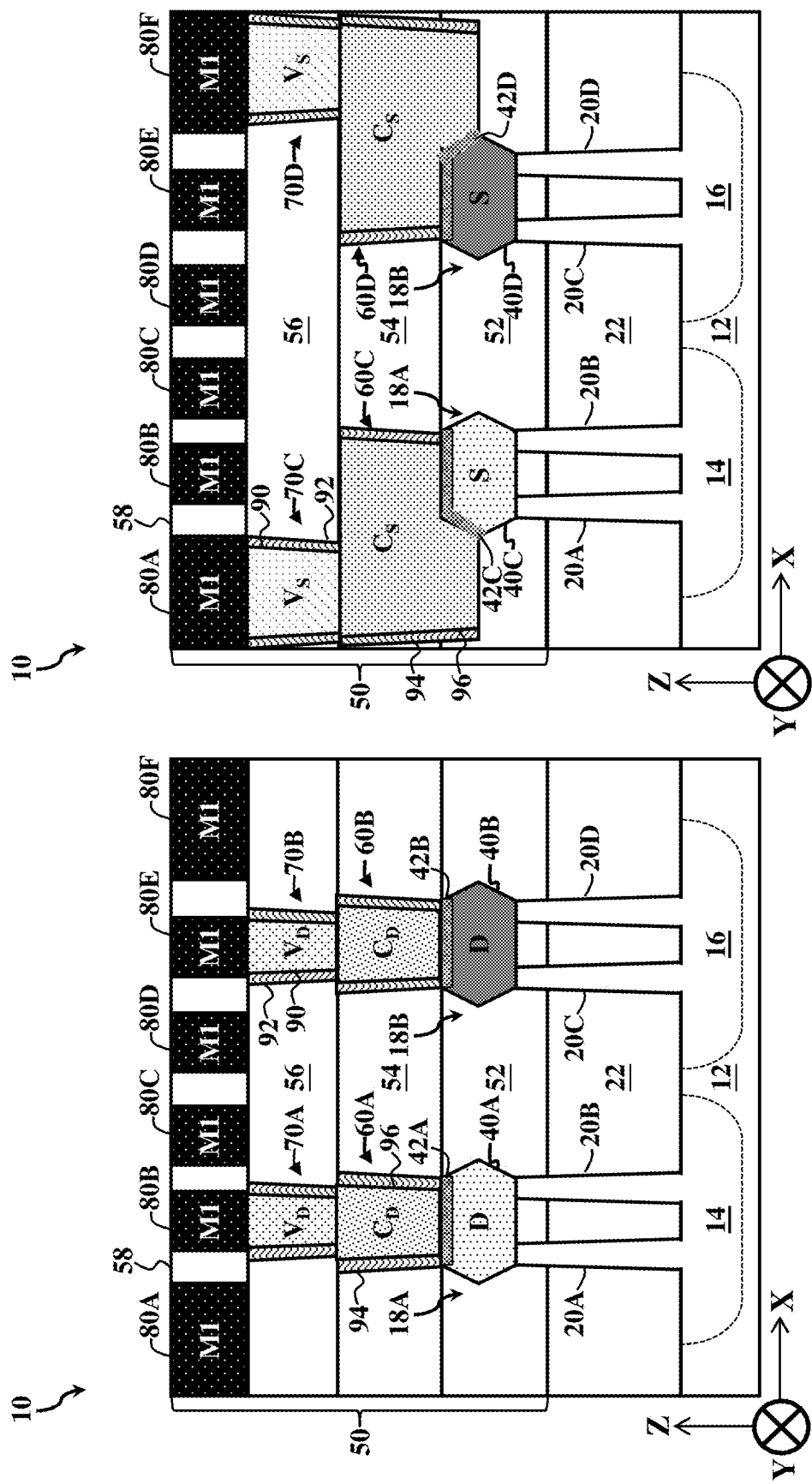
FIG. 6A is yet another diagrammatic cross-sectional view of the FinFET device of FIG. 1A along line B-B according to various aspects of the present disclosure.
FIG. 6B is yet another diagrammatic cross-sectional view of the FinFET device of FIG. 1A along line C-C according to various aspects of the present disclosure.

In some implementations, at least one of device-level contacts 60A-60D includes a contact liner layer that includes a high-k dielectric material. For example, in FIG. 6A and FIG. 6B, similar to vias 70A-70D, device-level contacts 60A-60D include a contact liner layer 94 that includes a high-k dielectric material, and a contact bulk layer 96 that includes a conductive material. In some implementations, the high-k dielectric material includes a nitride-based dielectric material, a metal oxide-based dielectric material, a hafnium-based dielectric material, other suitable high-k dielectric material, or combinations thereof. For example, the high-k dielectric material includes $HfO_2$, HfSiO, HfSiON, HfTaO, HfTiO, HfZrO, $HfO_2$—$Al_2O_3$, tantalum oxide, titanium oxide, zirconium oxide, aluminum oxide, other suitable high-k dielectric materials, or combinations thereof. Contact liner layer 94 and contact bulk layer 96 fill contact openings having sidewalls defined by ILD layer 54 and/or ILD layer 52 and bottoms defined by respective FinFET device features, such as epitaxial source/drain features 40A-40D. In the depicted embodiment, contact liner layer 94 is disposed on sidewalls of device-level contacts 60A-60D, and contact bulk layer 96 is disposed on contact liner layer 94. In some implementations, contact liner layer 94 has a thickness of about 5 Å to about 30 Å. In some implementations, though not depicted, device-level contact 60E (FIG. 2) includes contact liner layer 94 and contact bulk layer 96.

The interconnect structures described herein can be implemented in various logic circuits. FIG. 7A is a simplified circuit diagram of a FinFET-based NAND logic circuit 100, in portion or entirety, according to various aspects of the present disclosure; and FIG. 7B is a simplified schematic top view of an interconnect structure of FinFET-based NAND logic circuit 100, in portion or entirety, according to various aspects of the present disclosure. FinFET-based NAND logic circuit 100 can be included in a microprocessor, a memory cell, and/or other IC device. In some implementations, FinFET-based NAND logic circuit 100 is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 7A and FIG. 7B have been simplified for the sake of clarity to better understand the inventive concepts of the present disclosure. Additional features can be added in FinFET-based NAND logic circuit 100, and some of the features described below can be replaced, modified, or eliminated in other embodiments of FinFET-based NAND logic circuit 100.

In FIG. 7A, FinFET-based NAND logic circuit 100 includes a FinFET 102, a FinFET 104, a FinFET 106, and a FinFET 108. In the depicted embodiment, FinFET 102 and FinFET 106 are configured as PMOS FinFETs (PMOSFET1 and PMOSFET2, respectively), similar to FinFET 18A, and FinFET 104 and FinFET 108 are configured as NMOS FinFETs (NMOSFET1 and NMOSFET2, respectively), similar to FinFET 18B. FinFET 102, FinFET 104, FinFET 106, and FinFET 108 each include a gate (G) that interposes a source (S) and drain (D). For example, FinFET 102 and FinFET 106 each have a gate that interposes a source (electrically coupled with a power supply voltage ($V_{DD}$)) and a common drain (CD); FinFET 104 has a gate that interposes a source and a drain; and FinFET 108 has a gate that interposes a source (electrically coupled with a power supply voltage ($V_{SS}$)) and a drain. In the depicted embodiment, FinFET 104 and FinFET 108 share a common active region (COD) (for example, a common doped region), such that the source of FinFET 104 is electrically coupled to the drain of FinFET 108. FinFET-based NAND logic circuit 100 further includes more than one input (here, a first input (INPUT-1) and a second input (INPUT-2)) and one output (here, OUTPUT), where OUTPUT is low (for example, a logic zero) when both INPUT-1 and INPUT-2 are high (for example, a logic one (1)) and OUTPUT is high when both INPUT-1 and INPUT-2 are low or when either INPUT-1 or INPUT-2 are high. INPUT-1 is electrically coupled with gates of FinFET 102 and FinFET 104 via node 110, and INPUT-2 is electrically coupled with gates of FinFET 106 and FinFET 108 via node 112. In some implementations, INPUT-1 and INPUT-2 are respectively coupled with a bit line BL and a bit line BLB, for example, of a memory circuit. OUTPUT is electrically coupled with the common drain of FinFETs 102, 106 and the drain of FinFET 104 via node 114. Electrical functionality of FinFET-based NAND logic circuit 100 is optimized by implementing the optimized interconnect structures disclosed herein.

In FIG. 7B, FinFET-based NAND logic circuit 100 includes a substrate 202 that includes a doped region 204 and doped region 206, which are similar to substrate 12, doped region 14, and doped region 16 described above. Various fins (here, a fin 220A, a fin 220B, a fin 220C, and a fin 220D) are disposed over substrate 202, where fins 220A-220D are similar to fins 20A-20D described above. In the depicted embodiment, FinFET 102 and FinFET 106 include fin 220A and fin 220B, and FinFET 104 and FinFET 108 include fin 220C and fin 220D. An isolation feature, such as isolation feature 22 described above, is configured to isolate FinFET 102, FinFET 104, FinFET 106, and FinFET 108 from one another. The isolation feature further isolates fins 220A-220D from one another. Various gate structures (here, a gate structure 230A, a gate structure 230B, a gate structure 230C, and a gate structure 230D) are disposed over fins 220A-220D, where gate structures 230A, 230B are configured as active gate structures and gate structures 230C, 230D are configured as dummy gate structures. Gate structures 230A-230D are similar to gate structures 30A-30C described above. Gate structure 230A interposes a source region and a drain region of both FinFET 106 and FinFET 108, and gate structure 230B interposes a source region and a drain region of both FinFET 102 and FinFET 104. Though not depicted, the source regions and the drain regions include epitaxial source/drain features and silicide layers, such as epitaxial source/drain features 40A-40D and silicide layers 42A-42D described above.

An MLI feature, similar to MLI feature 50 described above, facilitates operation of FinFET-based NAND logic circuit 100. In the depicted embodiment, the MLI feature includes device-level contacts 260A-260F (similar to device-level contacts 60A-60D described above), vias 270A-270G (similar to vias 70A-70E described above), and conductive lines 280A-280F (similar to conductive lines 80A-80F). In the depicted embodiment, device-level contacts 260A, 260B, 260C are source contacts that physically (or directly) connect the source regions of FinFET 106, FinFET 108, and FinFET 102 respectively to vias 270A, 270B, 270C; device-level contacts 260D, 260E are drain contacts that physically (or directly) connect the drain regions of FinFET 106, FinFET 102, and FinFET 104 respectively to vias 270D, 270E; and device-level contact 260F is a common active region contact that physically (or directly) connects the source region of FinFET 104 and the drain region of FinFET 108 to conductive line 280F. In furtherance of the depicted embodiment, vias 270A, 270B, 270C are source node vias that electrically couple source regions of FinFET 106, FinFET 108, and FinFET 102 to a metal one (M1) layer of the MLI feature; and vias 270D, 270E are drain node vias that electrically couple drain regions of FinFET 106 and FinFET 104 to the M1 layer of the MLI features. For example, via 270A is disposed on device-level contact 260A, such that via 270A physically (or directly) connects device-level contact 260A to conductive line 280A (which is electrically coupled to power supply voltage ($V_{DD}$)); via 270B is disposed on device-level contact 260B, such that via 270B physically (or directly) connects device-level contact 260B to conductive line 280F (which is electrically coupled to power supply voltage ($V_{SS}$)); via 270C is disposed on device-level contact 260C, such that via 270C physically (or directly) connects device-level contact2 60C to conductive line 280A; via 270D is disposed on device-level contact 260D, such that via 270D physically (or directly) connects device-level contact 260D to conductive line 280B; and via 270E is disposed on device-level contact 260E, such that via 270E physically (or directly) connects device-level contact 260E to conductive line 280E. Vias 270F, 270G are gate node vias that electrically couple gates of FinFET 102, FinFET 104, FinFET 106, and FinFET 108 to the M1 layer of the MLI features. For example, via 270F and via 270G are respectively disposed on gate structure 230A and gate structure 230B, such that via 270F and 270G physically (or directly) connect gate structure 230A and gate structure 230B respectively to conductive line 280C and conductive line 280D.

The MLI feature is configured to optimize performance of FinFET-based NAND logic circuit 100 while facilitating sub-micron feature sizes. For example, a source node via dimension ratio of the source node vias (here, vias 270A, 270B, 270C) is greater than a drain node via dimension ratio of the drain node vias (here, vias 270D, 270E). For example, the source node via dimension ratio is greater than 2, and the drain node via dimension ratio is less than 1.2. In some implementations, the drain node via dimension ratio is greater than 0.8. In some implementations, the source node via dimension ratio is also greater than a gate node via ratio of the gate node vias (here, vias 270F, 270G). In some implementations, the gate node via ratio is less than 1.2. In some implementations, the gate node via dimension ratio is greater than 0.8. In some implementations, the drain node via dimension ratio is greater than the gate node via dimension ratio. In some implementations, at least one dimension of the drain node vias is greater than the dimension of the gate node vias. For example, a width and/or a length of the drain node vias is greater than a width and/or a length of the gate node vias. In some implementations, the source node vias are rectangular shaped, while the drain node vias and the gate node vias are circular shaped. In some implementations, a source contact dimension ratio of source contacts (here, device-level contacts 260A, 260B, 260C) is greater than the source node via dimension ratio. For example, the device-level contact dimension ratio is greater than 3, and the source node via dimension ratio is greater than 2. In some implementations, at least one dimension of the source contacts is greater than the dimension of the source node vias. For example, a width and/or a length of the source contacts is greater than a width and/or a length of the source node vias. In some implementations, at least one dimension of the source contacts is greater than the dimension of the drain contacts. For example, a width and/or a length of the source contacts (here, device-level contacts 260A, 260B, 260C) is greater than a width and/or a length of the drain contacts (here, device-level contacts 260D, 260E).

Figures 8A, 8B:
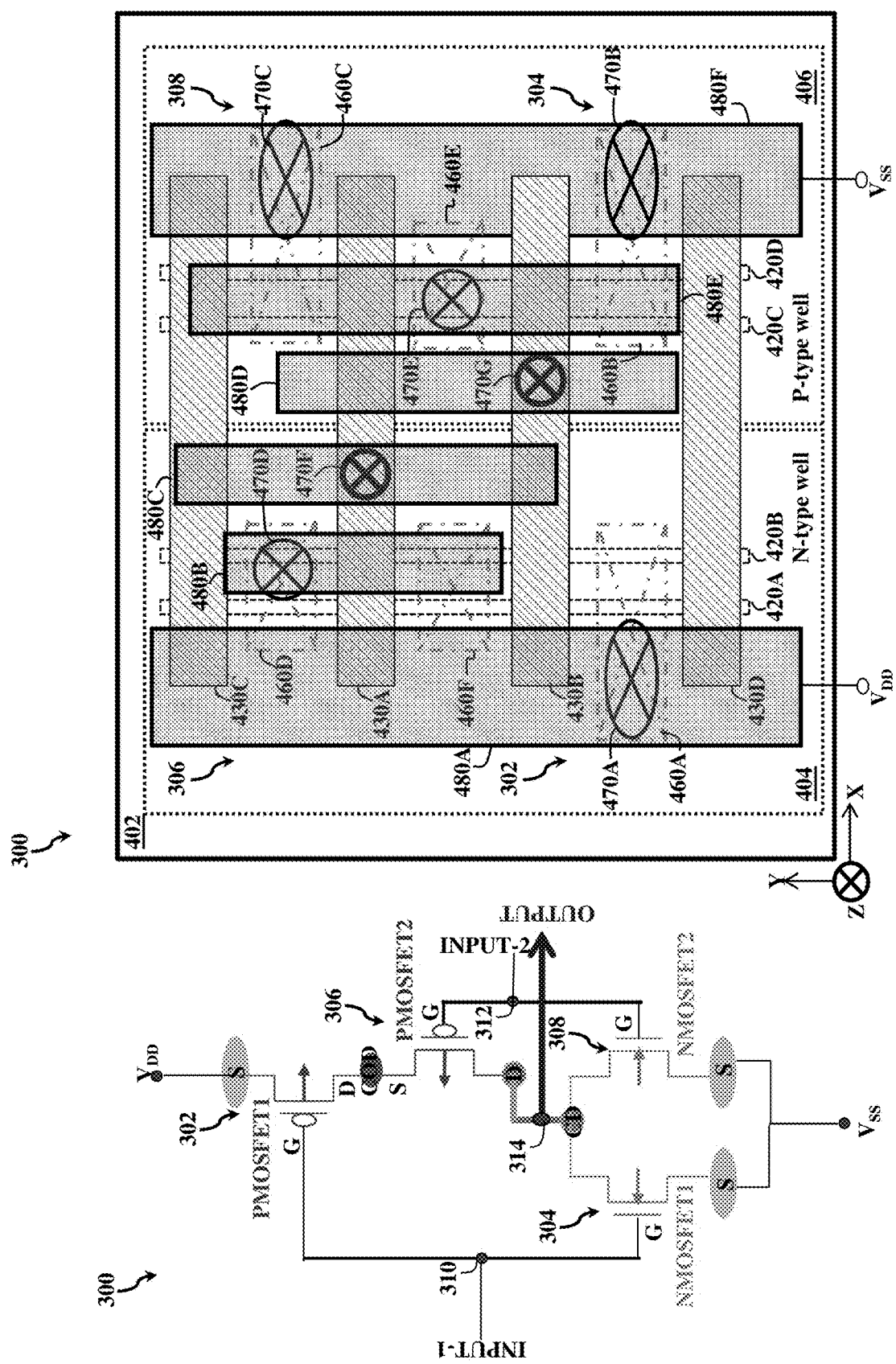
FIG. 8A is a simplified circuit diagram of a FinFET-based NOR logic circuit, in portion or entirety, according to various aspects of the present disclosure.
FIG. 8B is a simplified schematic top view of an interconnect structure of the FinFET-based NOR logic circuit of FIG. 8A according to various aspects of the present disclosure.

FIG. 8A is a simplified circuit diagram of a FinFET-based NOR logic circuit 300, in portion or entirety, according to various aspects of the present disclosure; and FIG. 8B is a simplified schematic top view of an interconnect structure of FinFET-based NOR logic circuit 300, in portion or entirety, according to various aspects of the present disclosure. FinFET-based NOR logic circuit 300 can be included in a microprocessor, a memory cell, and/or other IC device. In some implementations, FinFET-based NOR logic circuit 300 is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 8A and FIG. 8B have been simplified for the sake of clarity to better understand the inventive concepts of the present disclosure. Additional features can be added in FinFET-based NOR logic circuit 300, and some of the features described below can be replaced, modified, or eliminated in other embodiments of FinFET-based NOR logic circuit 300.

In FIG. 8A, FinFET-based NOR logic circuit 300 includes a FinFET 302, a FinFET 304, a FinFET 306, and a FinFET 308. In the depicted embodiment, FinFET 302 and FinFET 306 are configured as PMOS FinFETs (PMOSFET1 and PMOSFET2, respectively), similar to FinFET 18A, and FinFET 304 and FinFET 308 are configured as NMOS FinFETs (NMOSFET1 and NMOSFET2, respectively), similar to FinFET 18B. FinFET 302, FinFET 304, FinFET 306, and FinFET 308 each include a gate (G) that interposes a source (S) and a drain (D). For example, FinFET 304 and FinFET 308 each have a gate that interposes a source (electrically coupled with a power supply voltage ($V_{SS}$)) and a common drain (CD); FinFET 302 has a gate that interposes a source (electrically coupled with a power supply voltage ($V_{DD}$)) and a drain; and FinFET 306 has a gate that interposes a source and a drain. In the depicted embodiment, FinFET 302 and FinFET 306 share a common active region (COD) (for example, a common doped region), such that the drain of FinFET 302 is electrically coupled to the source of FinFET 306. FinFET-based NOR logic circuit 300 further includes more than one input (here, a first input (INPUT-1) and a second input (INPUT-2)) and one output (here, OUTPUT), where OUTPUT is high (for example, a logic one) when both INPUT-1 and INPUT-2 are low (for example, a logic zero) and OUTPUT is low when both INPUT-1 and INPUT-2 are high or when either INPUT-1 or INPUT-2 are high. INPUT-1 is electrically coupled with gates of FinFET 302 and FinFET 304 via node 310, and INPUT-2 is electrically coupled with gates of FinFET 306 and FinFET 308 via node 312. In some implementations, INPUT-1 and INPUT-2 are respectively coupled with a bit line BL and a bit line BLB, for example, of a memory circuit. OUTPUT is electrically coupled with the common drain of FinFETs 304, 308 and the drain of FinFET 306 via node 314. Electrical functionality of FinFET-based NOR logic circuit 300 is optimized by implementing the interconnect structures disclosed herein.

In FIG. 8B, FinFET-based NOR logic circuit 300 includes a substrate 402 that includes a doped region 404 and doped region 406, which are similar to substrate 12, doped region 14, and doped region 16 described above. Various fins (here, a fin 420A, a fin 420B, a fin 420C, and a fin 420D) are disposed over substrate 402, where fins 420A-420D are similar to fins 20A-20D described above. In the depicted embodiment, FinFET 302 and FinFET 304 include fin 420A and fin 420B, and FinFET 304 and FinFET 308 include fin 420C and fin 420D. An isolation feature (not shown), such as isolation feature 22 described above, is configured to isolate FinFET 302, FinFET 304, FinFET 306, and FinFET 308 from one another. The isolation feature further isolates fins 420A-420D from one another. Various gate structures (here, a gate structure 430A, a gate structure 430B, a gate structure 430C, and a gate structure 430D) are disposed over fins 420A-420D, where gate structures 430A, 430B are configured as active gate structures and gate structures 430C, 430D are configured as dummy gate structures. Gate structures 430A-430D are similar to gate structures 30A-30C described above. Gate structure 430A interposes a source region and a drain region of both FinFET 306 and FinFET 308, and gate structure 430B interposes a source region and a drain region of both FinFET 302 and FinFET 304. Though not depicted, the source regions and the drain regions include epitaxial source/drain features and silicide layers, such as epitaxial source/drain features 40A-40D and silicide layers 42A-42D described above.

An MLI feature, similar to MLI feature 50 described above, facilitates operation of FinFET-based NOR logic circuit 300. In the depicted embodiment, the MLI feature includes device-level contacts 460A-460F (similar to device-level contacts 60A-60D described above), vias 470A-470G (similar to vias 70A-70E described above), and conductive lines 480A-480F (similar to conductive lines 80A-80F). In the depicted embodiment, device-level contacts 460A, 460B, 460C are source contacts that physically (or directly) connect the source regions of FinFET 302, FinFET 304, and FinFET 308 respectively to vias 470A, 470B, 470C; device-level contacts 460D, 460E are drain contacts that physically (or directly) connect the drain regions of FinFET 306, FinFET 304, and FinFET 308 respectively to vias 470D, 470E; and device-level contact 460F is a common active region contact that physically (or directly) connects the source region of FinFET 306 and the drain region of FinFET 302 to conductive line 480A. In furtherance of the depicted embodiment, vias 470A, 470B, 470C are source node vias that electrically couple source regions of FinFET 302, FinFET 304, and FinFET 306 to a metal one (M1) layer of the MLI feature; and vias 470D, 470E are drain node vias that electrically couple drain regions of FinFET 306, FinFET 304, and FinFET 308 to the M1 layer of the MLI features. For example, via 470A is disposed on device-level contact 460A, such that via 470A physically (or directly) connects device-level contact 460A to conductive line 480A (which is electrically coupled to power supply voltage ($V_{DD}$)); via 470B is disposed on device-level contact 460B, such that via 470B physically (or directly) connects device-level contact 460B to conductive line 480F (which is electrically coupled to power supply voltage ($V_{SS}$)); via 470C is disposed on device-level contact 460C, such that via 470C physically (or directly) connects device-level contact2 60C to conductive line 480F; via 470D is disposed on device-level contact 460D, such that via 470D physically (or directly) connects device-level contact 460D to conductive line 480B; and via 470E is disposed on device-level contact 460E, such that via 470E physically (or directly) connects device-level contact 460E to conductive line 480E. Vias 470F, 470G are gate node vias that electrically couple gates of FinFET 302, FinFET 304, FinFET 306, and FinFET 308 to the M1 layer of the MLI feature. For example, via 470F and via 470G are respectively disposed on gate structure 430A and gate structure 430B, such that via 470F and 470G physically (or directly) connect gate structure 430A and gate structure 430B respectively to conductive line 480C and conductive line 480D.

The MLI feature is configured to optimize performance of FinFET-based NOR logic circuit 300 while facilitating sub-micron feature sizes. For example, a source node via dimension ratio of the source node vias (here, vias 470A, 470B, 470C) is greater than a drain node via dimension ratio of the drain node vias (here, vias 470D, 470E). For example, the source node via dimension ratio is greater than 2, and the drain node via dimension ratio is less than 1.2. In some implementations, the drain node via dimension ratio is greater than 0.8. In some implementations, the source node via dimension ratio is also greater than a gate node via ratio of the gate node vias (here, vias 470F, 470G). In some implementations, the gate node via ratio is less than 1.2. In some implementations, the gate node via dimension ratio is greater than 0.8. In some implementations, the drain node via dimension ratio is greater than the gate node via dimension ratio. In some implementations, at least one dimension of the drain node vias is greater than the dimension of the gate node vias. For example, a width and/or a length of the drain node vias is greater than a width and/or a length of the gate node vias. In some implementations, the source node vias are rectangular shaped, while the drain node vias and the gate node vias are circular shaped. In some implementations, a source contact dimension ratio of source contacts (here, device-level contacts 460A, 460B, 460C) is greater than the source node via dimension ratio. For example, the device-level contact dimension ratio is greater than 3, and the source node via dimension ratio is greater than 2. In some implementations, at least one dimension of the source contacts is greater than the dimension of the source node vias. For example, a width and/or a length of the source contacts is greater than a width and/or a length of the source node vias. In some implementations, at least one dimension of the source contacts is greater than the dimension of the drain contacts. For example, a width and/or a length of the source contacts (here, device-level contacts 460A, 460B, 460C) is greater than a width and/or a length of the drain contacts (here, device-level contacts 460D, 460E).

Figure 9:
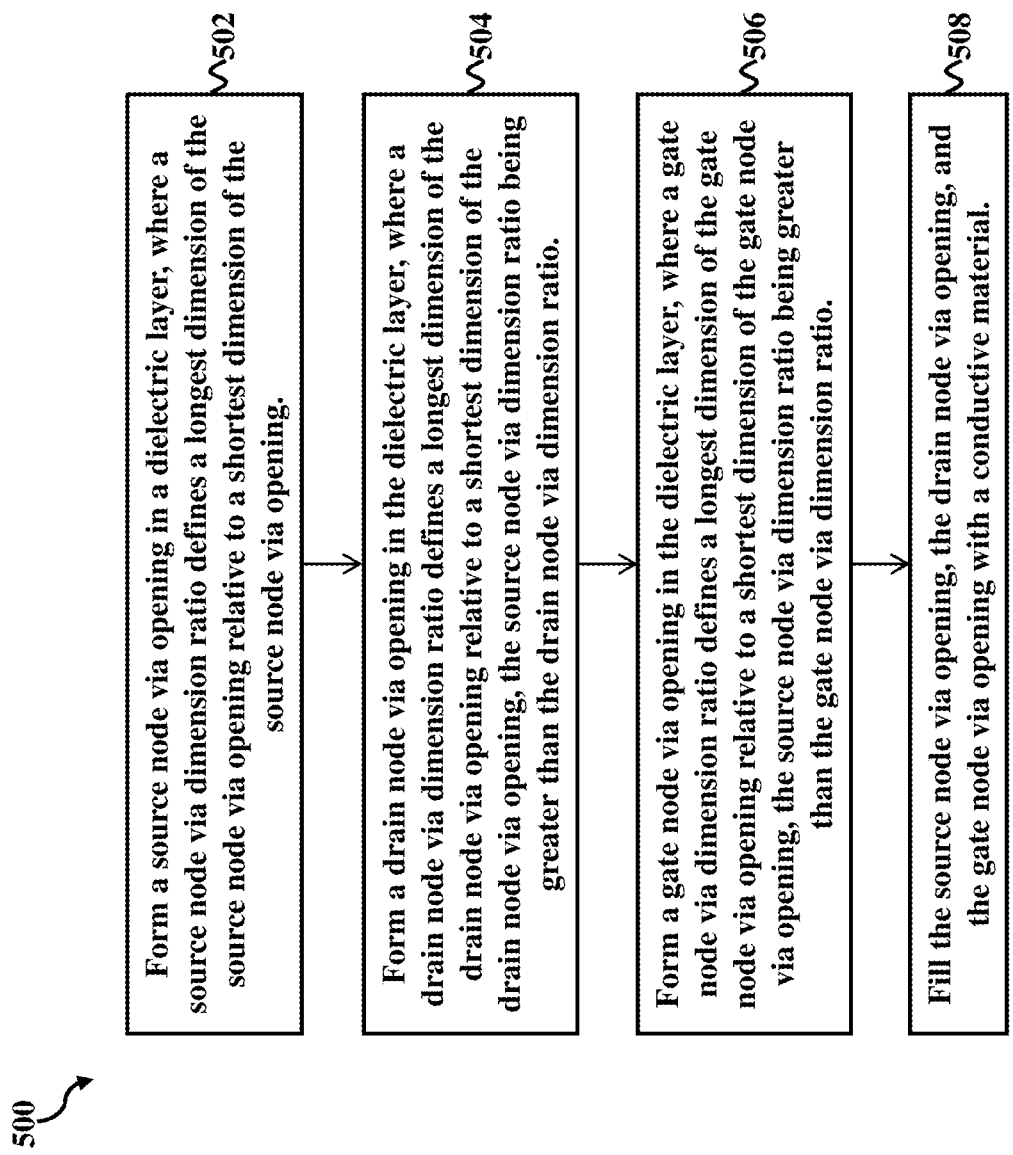
FIG. 9 is a flow chart of a method for fabricating an interconnect structure for a FinFET device according to various aspects of the present disclosure.

FIG. 9 is a flow chart of a method 500 for fabricating an interconnect structure for a FinFET device, such as the interconnect structures described above, according to various aspects of the present disclosure. At block 502, method 500 includes forming a source node via opening in a dielectric layer, where a source node via dimension ratio defines a longest dimension of the source node via opening relative to a shortest dimension of the source node via opening. At block 504, a drain node via opening is formed in the dielectric layer, where a drain node via dimension ratio defines a longest dimension of the drain node via opening relative to a shortest dimension of the drain node via opening, the source node via dimension ratio being greater than the drain node via dimension ratio. At block 506, a gate node via opening is formed in the dielectric layer, where a gate node via dimension ratio defines a longest dimension of the gate node via opening relative to a shortest dimension of the gate node via opening, the source node via dimension ratio being greater than the gate node via dimension ratio. At block 508, the source node via opening, the drain node via opening, and the gate node via opening are filled with a conductive material. In some implementations, the conductive material includes a via liner layer (including, for example, a high-k dielectric material) and a via bulk layer. Additional steps can be provided before, during, and after method 500, and some of the steps described can be moved, replaced, or eliminated for additional embodiments of method 500.

The present disclosure provides for many different embodiments. Interconnect structures and corresponding techniques for forming the interconnect structures are disclosed herein. Interconnect structures and corresponding formation techniques for fin-like field effect transistors (FinFETs) are disclosed herein. An exemplary interconnect structure for a FinFET includes a gate node via electrically coupled to a gate of the FinFET, a source node via electrically coupled to a source of the FinFET, and a drain node via electrically coupled to a drain of the FinFET. A source node via dimension ratio defines a longest dimension of the source node via relative to a shortest dimension of the source node via, and a drain node via dimension ratio defines a longest dimension of the drain node via relative to a shortest dimension of the drain node via. The source node via dimension ratio is greater than the drain node via dimension ratio. In some implementations, the source node via dimension ratio is greater than 2, and the drain node via dimension ratio is less than 1.2. In some implementations, a gate node via dimension ratio defines a longest dimension of the gate node via relative to a shortest dimension of the gate node via, where the gate node via dimension ratio is less than 1.2. In some implementations, the longest dimension or the shortest dimension of the drain node via is greater than the longest dimension or the shortest dimension of the gate node via.

In some implementations, the interconnect structure further includes a source contact that physically couples the source node via to the source and a drain contact that physically couples the drain node via to the drain. In some implementations, the gate node via is physically coupled to the gate. In some implementations, the interconnect structure further includes a gate contact that physically couples the gate node via to the gate. In some implementations, a source contact dimension ratio defines a longest dimension of the source contact relative to a shortest dimension of the source contact, and further wherein the source contact dimension ratio is greater than the source node via dimension ratio. In some implementations, the source node via dimension ratio is greater than 2, and the source contact dimension ratio is greater than 3. In some implementations, at least one of the gate node via, the source node via, or the drain node via have a via liner layer that includes a high-k dielectric material.

An exemplary interconnect structure for a FinFET device includes a gate structure that interposes a first source and a first drain of a first FinFET. The gate structure further interposes a second source and a second drain of a second FinFET. The interconnect structure further includes a gate node via electrically coupled to the gate structure, a first source node via and a second source node via electrically coupled respectively to the first source and the second source, and a first drain node via and a second drain node via electrically coupled respectively to the first drain and the second drain. A first via dimension ratio of the first source node via and the second source node via is greater than a second via dimension ratio of the gate node via. The first via dimension ratio is greater than a third via dimension ratio of the first drain node via and the second drain node via. In some implementations, the first via dimension ratio is greater than 2, the second via dimension ratio is less than 1.2, and the third via dimension ratio is less than 1.2. In some implementations, the gate node via is smaller than the first drain node via and the second drain node via. In some implementations, the first FinFET is a p-type FinFET and the second FinFET is an n-type FinFET.

In some implementations, the first source node via, the second source node via, the first drain node via, and the second drain node via have sidewalls lined with a high-k dielectric material. In some implementations, the interconnect structure further includes a first source contact and a second source contact that physically couple respectively the first source node via to the first source and the second source node via to the second source, and a first drain contact and a second drain contact that physically couple respectively the first drain node via to the first drain and the second drain node via to the second drain. In some implementations, a source dimension ratio of the first source contact and the second source contact is greater than the first via dimension ratio.

An exemplary method for forming an interconnect structure for a FinFET includes forming a source node via opening in a dielectric layer and forming a drain node via opening in the dielectric layer. A source node via dimension ratio defines a longest dimension of the source node via opening relative to a shortest dimension of the source node via opening. A drain node via dimension ratio defines a longest dimension of the drain node via opening relative to a shortest dimension of the drain node via opening. The source node via dimension ratio is greater than the drain node via dimension ratio. The method further includes filling the source node via opening and the drain node via opening with a conductive material, such that a source node via is formed that is electrically coupled to a source of the FinFET and a drain node via is formed that is electrically coupled to a drain of the FinFET. In some implementations, filling the source node via opening and the drain node via opening with the conductive material includes forming a via liner layer along sidewalls of the source node via opening and the drain node via opening and forming a via bulk layer over the via liner layer. The via liner layer includes a high-k dielectric material. In some implementations, the method further includes forming a gate node via opening in the dielectric layer. A gate node via dimension ratio defines a longest dimension of the gate node via opening relative to a shortest dimension of the gate node via opening, the source node via dimension ratio being greater than the gate node via dimension ratio.

An exemplary logic circuit includes a first p-type FinFET, a first n-type FinFET, a second p-type FinFET, and a second n-type FinFET. A first source node via is electrically coupled to a source of the first p-type FinFET, a second source node via is electrically coupled to a source of the second p-type FinFET, and a third source node via is electrically coupled to a source of the second n-type FinFET. A first drain node via is electrically coupled to a drain of the first p-type FinFET and a drain of the second p-type FinFET, and a second drain node via is electrically coupled to a drain of the first n-type FinFET. The first source node via, the second source node via, and the third source node via each have a first via dimension ratio. The first drain node via and the second drain node via each have a second via dimension ratio. The first via dimension ratio is greater than the second via dimension ratio. In some implementations, the logic circuit further includes a first gate node via electrically coupled to gates of the first pair of FinFETs, and a second gate node via electrically coupled to gates of the second pair of FinFETs. The first via dimension ratio is greater than a third via dimension ratio of the first gate node via and the second gate node via. In some implementations, the drain of the first p-type FinFET and the second p-type FinFET is a common drain. In some implementations, a source of the first n-type FinFET and a drain of the second n-type FinFET is a common active region.

Another exemplary logic circuit includes a first p-type FinFET, a first n-type FinFET, a second p-type FinFET, and a second n-type FinFET. A first source node via is electrically coupled to a source of the first p-type FinFET, a second source node via is electrically coupled to a source of the first n-type FinFET, and a third source node via is electrically coupled to a source of the second n-type FinFET. A first drain node via is electrically coupled to a drain of the second p-type FinFET, and a second drain node via is electrically coupled to a drain of the first n-type FinFET and a drain of the second n-type FinFET. The first source node via, the second source node via, and the third source node via each have a first via dimension ratio. The first drain node via and the second drain node via each have a second via dimension ratio. The first via dimension ratio is greater than the second via dimension ratio. In some implementations, the logic circuit further includes a first gate node via electrically coupled to gates of the first pair of FinFETs and a second gate node via electrically coupled to gates of the second pair of FinFETs. The first via dimension ratio is greater than a third via dimension ratio of the first gate node via and the second gate node via. In some implementations, the drain of the first n-type FinFET and the second n-type FinFET is a common drain. In some implementations, a drain of the first p-type FinFET and a source of the second p-type FinFET is a common active region.

An exemplary integrated circuit device includes a fin-like field effect transistor (FinFET) having a gate, a source, and a drain, wherein the gate interposes the source and the drain. The integrated circuit device further includes a multi-layer interconnect (MLI) feature configured to facilitate operation of the FinFET device. The MLI feature includes a dielectric layer disposed over the FinFET, a gate node via disposed in the dielectric layer, a source node via disposed in the dielectric layer, and a drain node via disposed in the dielectric layer. The gate node via is electrically coupled to the gate, the source node via is electrically coupled to the source, and the drain node via is electrically coupled to the drain. A source node via dimension ratio is greater than a drain node via dimension ratio and a gate node via dimension ratio. In some implementations, the source node via dimension ratio is greater than 2, the drain node via dimension ratio is less than 1.2, and the gate node via dimension ratio is less than 1.2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure for a fin-like field effect transistor (FinFET), the interconnect structure comprising:
   a source contact disposed over and physically contacting a source of the FinFET;
   a drain contact disposed over and physically contacting a drain of the FinFET;
   a gate node via coupled to a gate structure of the FinFET;
   a source node via disposed over and physically contacting the source contact without physically contacting the gate structure, wherein a source node via dimension ratio defines a longest source node via dimension of the source node via relative to a shortest source node via dimension of the source node via;

a drain node via disposed over and physically contacting the drain contact without physically contacting the gate structure, wherein a drain node via dimension ratio defines a longest drain node via dimension of the drain node via relative to a shortest source node via dimension of the drain node via; and wherein the source node via dimension ratio is greater than the drain node via dimension ratio.

2. The interconnect structure of claim 1, wherein the source node via dimension ratio is greater than 2, and the drain node via dimension ratio is less than 1.2.

3. The interconnect structure of claim 2, wherein a gate node via dimension ratio defines a longest gate node via dimension of the gate node via relative to a shortest gate node via dimension of the gate node via, and further wherein the gate node via dimension ratio is less than 1.2.

4. The interconnect structure of claim 3, wherein the longest drain node via dimension is greater than the longest gate node via dimension.

5. The interconnect structure of claim 1, wherein the source node via is not disposed over fins of the FinFET, and the drain node via is disposed over at least one of the fins of the FinFET.

6. The interconnect structure of claim 1, wherein the source node via and the drain node via do not extend over the gate structure.

7. The interconnect structure of claim 1, further comprising:
a first interlayer dielectric (ILD) layer of a multi-layer interconnect (MLI) feature;
a second ILD layer of the MLI feature disposed over the first ILD layer; and
a third ILD layer of the MLI feature disposed over the second ILD layer, wherein:
the first ILD layer is a bottommost ILD layer of the MLI feature and the first ILD layer is disposed over the gate structure, the source, and the drain of the FinFET;
the source contact and the drain contact are disposed in the second ILD layer; and
the source node via, the drain node via, and the gate node via are disposed in the third ILD layer.

8. The interconnect structure of claim 1, wherein:
a source contact dimension ratio defines a longest source contact dimension of the source contact relative to a shortest source contact dimension of the source contact, and
the source contact dimension ratio is greater than the source node via dimension ratio.

9. The interconnect structure of claim 8, wherein the source node via dimension ratio is greater than 2, and the source contact dimension ratio is greater than 3.

10. The interconnect structure of claim 1, wherein at least one of the gate node via, the source node via, or the drain node via have a via liner layer that includes a high-k dielectric material.

11. An interconnect structure for a fin-like field effect transistor (FinFET) device, the interconnect structure comprising:
a gate node via coupled to a gate structure, wherein the gate structure interposes a first source and a first drain of a first FinFET, the gate structure interposes a second source and a second drain of a second FinFET, and the gate node via has a first width substantially along a gate length direction and a first length substantially along a fin length direction, wherein the gate length direction is different than the fin length direction;
a first source contact disposed directly on the first source and a second source contact disposed directly on the second source;
a first drain contact disposed directly on the first drain and a second drain contact disposed directly on the second drain;
a first source node via disposed directly on the first source contact without extending over the first source of the first FinFET and a second source node via disposed directly on the second source contact without extending over the second source of the second FinFET, and wherein the first source node via and the second source node via each have a second width substantially along the gate length direction and a second length substantially along the fin length direction;
a first drain node via disposed directly on the first drain contact and a second drain node via disposed directly on the second drain contact, wherein the first drain node via and the second drain node via each have a third width substantially along the gate length direction and a third length substantially along the fin length direction;
wherein a first via dimension ratio of the second width to the second length of the first source node via and the second source node via is greater than a second via dimension ratio of the first width to the first length of the gate node via; and
wherein the first via dimension ratio of the second width to the second length of the first source node via and the second source node via is greater than a third via dimension ratio of the third width to the third length of the first drain node via and the second drain node via.

12. The interconnect structure of claim 11, wherein the first via dimension ratio is greater than 2, the second via dimension ratio is less than 1.2, and the third via dimension ratio is less than 1.2.

13. The interconnect structure of claim 11, further comprising:
a first conductive line disposed directly on the gate node via, wherein the gate node via couples the gate structure to the first conductive line;
a second conductive line disposed directly on the first source node via, wherein the first source node via couples the first source to the second conductive line;
a third conductive line disposed directly on the second source node via, wherein the second source node via couples the second source to the third conductive line;
a fourth conductive line disposed directly on the first drain node via, wherein the first drain node via couples the first drain to the fourth conductive line; and
a fifth conductive line disposed directly on the second drain node via, wherein the second drain node via couples the second drain to the fifth conductive line.

14. The interconnect structure of claim 11, wherein:
the first source contact is aligned substantially with the and a second source contact along the gate length direction;
the first source node via is aligned substantially with the second source node via along the gate length direction;
the first drain contact is aligned substantially with the second drain contact along the gate length direction; and
the first drain node via is aligned substantially with the second drain node via along the gate length direction.

15. The interconnect structure of claim 11, wherein gate structure is a first gate structure, the second length is less than a spacing between the first gate structure and a second gate structure, and the third length is less than a spacing between the first gate structure and a third gate structure, wherein the first gate structure is disposed between the second gate structure and the third gate structure.

16. The interconnect structure of claim 11, wherein the first source node via, the second source node via, the first drain node via, and the second drain node via have sidewalls lined with a high-k dielectric material.

17. The interconnect structure of claim 11, wherein the first FinFET is a p-type FinFET and the second FinFET is an n-type FinFET.

18. A method for forming an interconnect structure for a fin-like field effect transistor (FinFET), the method comprising:
  forming a source node via opening in a dielectric layer that exposes a source contact disposed over a source of the FinFET without exposing a gate structure of the FinFET, wherein a source node via dimension ratio defines a longest dimension of the source node via opening relative to a shortest dimension of the source node via opening;
  forming a drain node via opening in the dielectric layer that exposes a drain contact disposed over a drain of the FinFET without exposing the gate structure of the FinFET, wherein a drain node via dimension ratio defines a longest dimension of the drain node via opening relative to a shortest dimension of the drain node via opening, and further wherein the source node via dimension ratio is greater than the drain node via dimension ratio; and
  filling the source node via opening and the drain node via opening with a conductive material, such that a source node via is formed that is electrically coupled to a source of the FinFET and a drain node via is formed that is electrically coupled to a drain of the FinFET.

19. The method of claim 18, wherein filling the source node via opening and the drain node via opening with the conductive material includes:
  forming a via liner layer along sidewalls of the source node via opening and the drain node via opening, wherein the via liner layer includes a high-k dielectric material; and
  forming a via bulk layer over the via liner layer.

20. The method of claim 18, further comprising forming a gate node via opening in the dielectric layer, wherein a gate node via dimension ratio defines a longest dimension of the gate node via opening relative to a shortest dimension of the gate node via opening, the source node via dimension ratio being greater than the gate node via dimension ratio.

* * * * *